United States Patent
David et al.

(10) Patent No.: US 8,945,808 B2
(45) Date of Patent: *Feb. 3, 2015

(54) SELF-TOPCOATING RESIST FOR PHOTOLITHOGRAPHY

(75) Inventors: Robert Allen David, San Jose, CA (US); Phillip Joe Brock, Sunnyvale, CA (US); Carl E Larson, San Jose, CA (US); Daniel Paul Sanders, San Jose, CA (US); Ratnam Sooriyakumaran, San Jose, CA (US); Linda Karin Sundberg, Los Gatos, CA (US); Hoa D Truong, San Jose, CA (US); Gregory Michael Wallraff, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 999 days.

This patent is subject to a terminal disclaimer.

(21) Appl. No.: 11/380,731

(22) Filed: Apr. 28, 2006

(65) Prior Publication Data

US 2007/0254235 A1    Nov. 1, 2007

(51) Int. Cl.
    G03F 7/039    (2006.01)
    G03F 7/09     (2006.01)
    G03F 7/20     (2006.01)
    G03F 7/30     (2006.01)
    G03F 7/36     (2006.01)

(52) U.S. Cl.
    USPC ............. 430/270.1; 430/272.1; 430/311; 430/313; 430/326; 430/330; 430/907; 430/910

(58) Field of Classification Search
    None
    See application file for complete search history.

(56) References Cited

U.S. PATENT DOCUMENTS

| | | | |
|---|---|---|---|
| 4,189,323 A | 2/1980 | Buhr | |
| 4,255,299 A | 3/1981 | Daimon et al. | |
| 4,395,566 A | 7/1983 | Covill et al. | |
| 4,472,494 A | 9/1984 | Hallman et al. | |
| 4,551,519 A | 11/1985 | Oxenrider | |
| 4,647,651 A | 3/1987 | Oxenrider | |
| 4,731,605 A | 3/1988 | Nixon | |
| 5,240,812 A | 8/1993 | Conley et al. | |
| 5,580,694 A | 12/1996 | Allen et al. | |
| 5,595,861 A | 1/1997 | Garza | |
| 5,679,495 A | 10/1997 | Yamachika et al. | |
| 5,744,537 A | 4/1998 | Brunsvold et al. | |
| 5,879,853 A | 3/1999 | Azuma | |
| 6,057,080 A | 5/2000 | Brunsvold et al. | |
| 6,191,476 B1 | 2/2001 | Takahashi et al. | |
| 6,274,295 B1 | 8/2001 | Dammel et al. | |
| 6,294,465 B1 * | 9/2001 | Hernandez et al. | 438/669 |
| 6,835,269 B1 | 12/2004 | Miharu et al. | |
| 6,844,134 B2 | 1/2005 | Choi et al. | |
| 7,041,748 B2 * | 5/2006 | Lin et al. | 525/474 |
| 7,067,231 B2 | 6/2006 | Harada et al. | |
| 7,193,023 B2 * | 3/2007 | Allen et al. | 526/242 |
| 7,306,853 B2 * | 12/2007 | Lin et al. | 428/447 |
| 7,358,029 B2 * | 4/2008 | Allen et al. | 430/270.1 |
| 7,521,172 B2 * | 4/2009 | David et al. | 430/270.1 |
| 7,714,079 B2 * | 5/2010 | Lin et al. | 525/474 |
| 7,820,369 B2 * | 10/2010 | Allen et al. | 430/330 |
| 7,951,524 B2 * | 5/2011 | Allen et al. | 430/270.1 |
| 8,003,309 B2 * | 8/2011 | Ito et al. | 430/322 |
| 8,034,532 B2 * | 10/2011 | Allen et al. | 430/270.1 |
| 8,236,482 B2 * | 8/2012 | Ito et al. | 430/322 |
| 2002/0090572 A1 * | 7/2002 | Sooriyakumaran et al. | 430/271.1 |
| 2002/0168581 A1 | 11/2002 | Takeda et al. | |
| 2002/0182541 A1 | 12/2002 | Gonsalves | |
| 2003/0008232 A1 * | 1/2003 | Kinsho et al. | 430/270.1 |
| 2003/0224283 A1 * | 12/2003 | Allen et al. | 430/270.1 |
| 2004/0013980 A1 | 1/2004 | Hatakeyama et al. | |
| 2004/0137241 A1 * | 7/2004 | Lin et al. | 428/447 |
| 2004/0137362 A1 | 7/2004 | De et al. | |
| 2004/0166436 A1 | 8/2004 | Rhodes et al. | |
| 2004/0197708 A1 * | 10/2004 | Kodama | 430/311 |
| 2004/0242821 A1 | 12/2004 | Hatakeyama et al. | |
| 2004/0265735 A1 | 12/2004 | Lee | |
| 2005/0010012 A1 | 1/2005 | Jost et al. | |
| 2005/0014090 A1 | 1/2005 | Hirayama et al. | |
| 2005/0079443 A1 * | 4/2005 | Noda et al. | 430/270.1 |
| 2005/0089792 A1 | 4/2005 | Huang et al. | |
| 2005/0106494 A1 | 5/2005 | Huang et al. | |
| 2005/0123852 A1 * | 6/2005 | Allen et al. | 430/270.1 |
| 2005/0147920 A1 * | 7/2005 | Lin et al. | 430/311 |
| 2005/0153236 A1 | 7/2005 | Lim et al. | |
| 2005/0164502 A1 | 7/2005 | Deng et al. | |
| 2005/0186516 A1 | 8/2005 | Endo et al. | |
| 2005/0250898 A1 | 11/2005 | Maeda et al. | |
| 2005/0266354 A1 | 12/2005 | Li et al. | |

(Continued)

FOREIGN PATENT DOCUMENTS

| | | | |
|---|---|---|---|
| JP | 2005-213215 A | * | 8/2005 |
| WO | 02 16517 | | 2/2002 |
| WO | WO2005/080306 A1 | * | 9/2005 |

OTHER PUBLICATIONS

DERWENT English abstract for JP2005-213215.*

(Continued)

*Primary Examiner* — Sin J. Lee

(74) *Attorney, Agent, or Firm* — Norris McLaughlin & Marcus, P.A.

(57) ABSTRACT

Resist compositions that can be used in immersion lithography without the use of an additional topcoat are disclosed. The resist compositions comprise a photoresist polymer, at least one photoacid generator, a solvent; and a self-topcoating resist additive. A method of forming a patterned material layer on a substrate using the resist composition is also disclosed.

16 Claims, 7 Drawing Sheets

(56) References Cited

U.S. PATENT DOCUMENTS

| | | |
|---|---|---|
| 2006/0008748 A1 | 1/2006 | Inabe et al. |
| 2006/0078823 A1* | 4/2006 | Kanda et al. ............... 430/270.1 |
| 2006/0105269 A1 | 5/2006 | Khojasteh et al. |
| 2006/0177765 A1* | 8/2006 | Harada et al. .............. 430/270.1 |
| 2006/0188804 A1 | 8/2006 | Allen et al. |
| 2006/0246373 A1* | 11/2006 | Wang ........................ 430/270.1 |
| 2007/0160930 A1* | 7/2007 | Wang et al. ................ 430/270.1 |
| 2008/0003517 A1* | 1/2008 | Komoriya et al. ............ 430/130 |

OTHER PUBLICATIONS

Machine-assisted English translation for JP2005-213215 as provided by JPO.*

M. Slezak "Exploring the needs and tradeoffs for immersionresist topcoating", Solid State Technology, vol. 47, Issue 7, Jul. 2004.

A. Hand, "Tricks with water and light: 193 nm Extension"; Semiconductor International, vol. 27, Issue 2, Feb. 2004.

E. Reichmanis, et al.; "Chemical amplification mechanisms for microlithography" Chemistry of materials 1991 v. 3 p. 394-407.

Allen, Robert D. et al.; "Design of Protective Topcoats for Immersion Lithography" Journal of photopolymer science and technology 2005 v. 18 n. 5 p. 615-619.

Eds. Thompson et al., Introduction to Microlithography, Washington, DC, American Chemical Society (1994).

Sanders, Daniel P, et al; Fluoroalcohol materials with tailored interfacial properties for immersion lithography; Proceedings of the SPIE ; vol. 6519; 651904-1, (Apr. 2007).

Hiroshi Ito , Advances in Polymer Science 2005, v. 172, p. 37-245, Chemical Amplification Resists for Microlithography.

Office Action issued on Apr. 16, 2009 by Examiner for corresponding US App. No. 11/380,744.

* cited by examiner

SELF-TOPCOATING RESIST FOR PHOTOLITHOGRAPHY

BACKGROUND OF THE INVENTION

1. Field of the Invention

The present invention relates to the fields of chemistry, photolithography and semiconductor fabrication. More specifically, the invention is directed to a resist composition comprising traditional resist components and additives that increase the contact angle of the resist film and lower the leaching rate of said components. The invention further relates to the resist compositions that can be used in immersion lithography without the use of an additional topcoat and a method of forming a photolithographic image, where a liquid such as water is interposed between the last lens fixture of an exposure tool and the photoresist-coated wafer.

2. Description of Related Art

The continuous drive to print smaller structures for advanced electronic device manufacturing requires the use of higher resolution optical lithography tools. Immersion lithography has the potential to extend current 193 nm argon fluoride-based technology to 45 nm critical dimensions (half-pitch DRAM) and beyond by effectively improving the depth-of-focus processing window for a given optical numerical aperture (NA). In addition, it enables lens designs with NA greater than 1.0, thus resulting in an increased resolution of optical scanners. The process requires filling the gap between the last lens element of the exposure tool and the resist-coated substrate with ultrapure water. See A. Hand, "Tricks with Water and Light: 193 nm Extension", Semiconductor International, Vol. 27, Issue 2, February 2004.

One of the technical challenges facing liquid immersion lithography is the diffusion between the photoresist components and the immersion medium. That is, during the immersion lithographic process, the photoresist components leach into the immersion medium and the immersion medium permeates into the photoresist film. Such diffusion is detrimental to photoresist performance and might result in disastrous lens damage or contamination in a 40 million dollar lithography tool. Therefore, there is a need for a method to prevent interaction between photoresist layers and immersion fluid in an immersion lithography system.

One of the methods that have been quickly adopted by the resist community is the application of topcoat materials on top of the photoresist layer for the purpose of eliminating diffusion of materials from the photoresist layer underneath, and to prevent the permeation of the exposure medium into the photoresist film. See M. Slezak, "Exploring the needs and tradeoffs for immersion resist topcoating", Solid State Technology, Vol. 47, Issue 7, July 2004. Since the time water was proposed as the exposure medium for 193 nm immersion lithography, several new topcoat materials have been reported.

As described above, protective topcoats are currently considered vitally important for water immersion lithography. However, this is as an additional step to conventional lithography, which adds process and material cost. Thus, there remains a need to develop resist compositions that can withstand the immersion conditions without the need for an additional topcoat.

SUMMARY OF THE INVENTION

The present invention relates to a resist additive compound that includes a polymer, oligomer or cage structure having the following general structure (A):

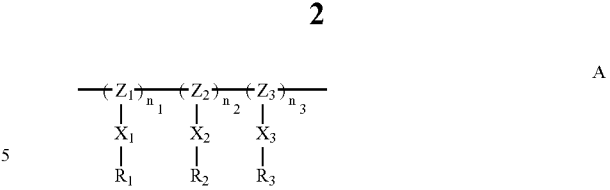

wherein,
each $Z_1$, $Z_2$, and $Z_3$ independently represents a member selected from the group consisting of linear, branched, or cyclic alkylene, linear, branched or cyclic heteroalkylene, carboxyl, carbonyl, and siloxyl;
$n_1$, $n_2$ and $n_3$ independently represent the number of repeat units of each type in the polymer, oligomer, or cage structure; and $n_1+n_2+n_3 \geq 2$;
$X_1$, $X$, and $X_3$ independently represents a member selected from the group consisting of linear, branched, or cyclic alkylene, linear, branched or cyclic heteroalkylene, carboxyl, and carbonyl;
$R_1$ is a fluoroalcohol group that is unprotected or partially or fully protected with an acid-labile group; and
$R_2$ is selected from H, carboxylic acid, sulfonamide, fluoroalcohol, or sulfonic acid, that is unprotected or partially or fully protected with an acid-labile group; and
$R_3$ is a nonfluorinated or partially fluorinated or perfluorinated functionality, other than a fluorinated ether, that is acid-labile or non-acid labile.

The present invention also relates to a resist composition comprising:
a) a photoresist polymer;
b) at least one photoacid generator;
c) a solvent; and
an additive including a polymer, oligomer or cage structure having the following structure A:

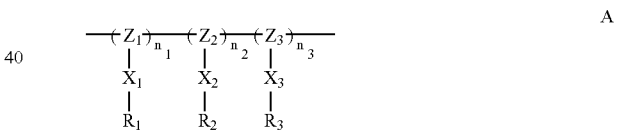

wherein,
each $Z_1$, $Z_2$, and $Z_3$ independently represents a member selected from the group consisting of linear, branched, or cyclic alkylene, linear, branched or cyclic heteroalkylene, carboxyl, carbonyl, and siloxyl;
$n_1$, $n_2$ and $n_3$ independently represent the number of repeat units of each type in the polymer, oligomer, or cage structure;
$X_1$, $X$, and $X_3$ independently represents a member selected from the group consisting of linear, branched, or cyclic alkylene, linear, branched or cyclic heteroalkylene, carboxyl, and carbonyl;
$R_1$ is a fluoroalcohol group that is unprotected or partially or fully protected with an acid-labile group; and
$R_2$ is selected from H, carboxylic acid, sulfonamide, fluoroalcohol, or sulfonic acid, that is unprotected or partially or fully protected with an acid-labile group; and
$R_3$ is a nonfluorinated or partially fluorinated or perfluorinated functionality, other than a fluorinated ether, that is acid-labile or non-acid labile.

The present invention further relates to a method of forming a patterned material layer on a substrate, the method comprising the following steps:

a) providing a substrate having a material layer on a surface thereof;
b) coating the material layer with the inventive resist composition as mentioned above thereby forming a coated substrate;
c) patternwise exposing the coated substrate to imaging irradiation; and
d) optionally baking the exposed substrate;
e) contacting the coated substrate with an aqueous alkaline developer, wherein a portion of the photoresist layer is removed from the substrate, thereby forming a patterned photoresist layer on the material layer; and
f) transferring the pattern in the photoresist layer to the material layer.

The invention also relates to a coated substrate comprising:
a) a substrate having a material layer on a surface thereof, and
b) a layer of the inventive resist composition mentioned above coated on the material layer.

BRIEF DESCRIPTION OF THE DRAWINGS

The invention will now be described in greater detail with reference to the drawings, wherein:

FIG. 4 shows at 130 nm 1:1 Line/Space arrays, dry exposure at 193 nm of Resist A with Polymer 22 additive (FIG. 4A) and without additive (FIG. 4B).

DETAILED DESCRIPTION OF THE INVENTION

Figure 1A:
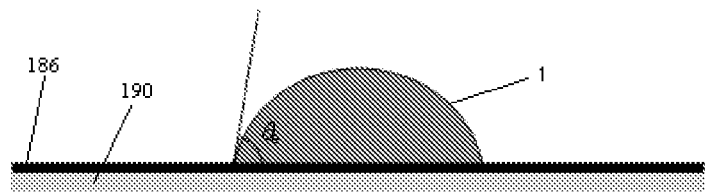
FIG. 1A shows the static contact angle to be the angle when all participating phases (i.e. air, water and resist film) have reached their natural equilibrium positions and the three phase line is not moving.

The present invention is directed in one embodiment to a process in which an additive is mixed into the resist. When coating the resist film, the additive segregates to the surface of the resist and acts as an in-situ topcoat or self-topcoating resist. The resist additive design scheme leads to high contact angles but maintains good lithographic performance and reduces the leaching of resist components (e.g., PhotoAcid Generators or PAGs) into the immersion fluid.

The resist additives of the current invention have the following properties:
1. Solubility in Resist Composition
2. High Surface Activity
3. Does not alter the dissolution of the resist significantly after exposure and bake
4. High fluid (i.e. water) contact angle
5. Blocks or reduces component leaching The additives of the present invention are either soluble in aqueous base developer or become soluble after exposure and bake. The additives of the present invention contain a low surface energy functionality, such as a fluorocarbyl moiety other than a fluorinated ether, in order to lower the surface energy.

In one embodiment, the compound includes a polymer or an oligomer having the structure A1:

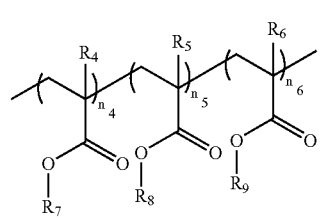

A1 wherein
$R_4$, $R_5$, and $R_6$ are independently H, alkyl, or fluoroalkyl;
$R_7$ is a linear, branched, or cyclic alkylene, linear, branched or cyclic heteroalkylene group containing one or more fluoroalcohol groups that are unprotected or partially or fully protected with an acid-labile group; and
$R_8$ is selected from H or linear, branched, or cyclic alkylene, linear, branched or cyclic heteroalkylene groups containing one or more carboxylic acid, sulfonamide, fluoroalcohol, or sulfonic acid moieties, that are unprotected or partially or fully protected with an acid-labile group; and
$R_9$ is a nonfluorinated or partially fluorinated or perfluorinated functionality, other than a fluorinated ether, that is acid-labile or non-acid labile;
$n_4$, $n_5$, and $n_6$ are integers such that $n_4+n_5+n_6$ is greater than or equal to 2.

In another embodiment, the compound includes a polymer or an oligomer having the structure A2:

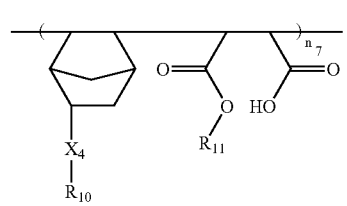

A2 wherein
$A_2$ is a polymer or an oligomer wherein,
$X_4$ is a member selected from the group consisting of linear, branched, or cyclic alkylene, linear, branched or cyclic heteroalkylene, carboxyl, and carbonyl;
$R_{10}$ and $R_{11}$ are independently selected from H and linear, branched, or cyclic alkylene, linear, branched or cyclic heteroalkylene groups containing one or more carboxylic acid, sulfonamide, fluoroalcohol, or sulfonic acid moieties, that are unprotected or partially or fully protected with an acid-labile group, or a nonfluorinated or partially fluorinated or perfluorinated functionality, other than a fluorinated ether, that is acid-labile or non-acid labile, provided that one of $R_{10}$ and $R_{11}$ is a partially fluorinated or perfluorinated functionality, other than a fluorinated ether, that is acid-labile or non-acid labile;

$n_7$ is an integer greater than or equal to 2.

In another embodiment, the compound includes a polymer or an oligomer having the structure A3:

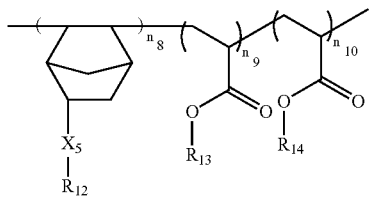

A3

$A_3$ is a polymer or an oligomer wherein, $X_5$ represents a member selected from the group consisting of linear, branched, or cyclic alkylene, linear, branched or cyclic heteroalkylene, carboxyl, and carbonyl;

$R_{12}$ is selected from H, carboxylic acid, sulfonamide, fluoroalcohol, or sulfonic acid, that is unprotected or partially or fully protected with an acid-labile group, or a nonfluorinated or partially fluorinated or perfluorinated functionality (other than a fluorinated ether) that is acid-labile or non-acid labile; and $R_{13}$ is a linear, branched, or cyclic alkylene, linear, branched or cyclic heteroalkylene group containing one or more fluoroalcohol groups that are unprotected or partially or fully protected with an acid-labile group; and $R_{14}$ is selected from H and linear, branched, or cyclic alkylene, linear, branched or cyclic heteroalkylene groups containing one or more carboxylic acid, sulfonamide, fluoroalcohol, or sulfonic acid moieties, that are unprotected or partially or fully protected with an acid-labile group, or a nonfluorinated or partially fluorinated or perfluorinated functionality (other than a fluorinated ether) that is acid-labile or non-acid labile, provided one of $R_{12}$ and $R_{14}$ is a fluorocarbyl moiety other than a fluorinated ether;

$n_8, n_9, n_{10}$ are integers such that $n_8+n_9+n_{10}$ is greater than or equal to 2.

In another embodiment, the compound includes a polymer, an oligomer or a cage structure having the structure A4:

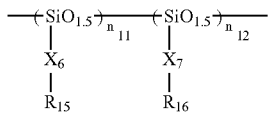

A4 wherein $A_4$ is a polymer, oligomer or cage structure wherein, $X_6$ and $X_7$ are independently selected from the group consisting of linear, branched, or cyclic alkylene, linear, branched or cyclic heteroalkylene, carboxyl, and carbonyl;

$R_{15}$ is selected from H, carboxylic acid, sulfonamide, fluoroalcohol, or sulfonic acid that is unprotected or partially or fully protected with an acid-labile group;

$R_{16}$ nonfluorinated or partially fluorinated or perfluorinated functionality, other than a fluorinated ether, that is acid-labile or non-acid labile; provided one of $R_{15}$ and $R_{16}$ is a fluorocarbyl moiety other than a fluorinated ether; and $n_{11}$ and $n_{12}$ are integers such that $n_{11}+n_{12}$ are greater than or equal to 2.

In another embodiment, the compound includes a polymer, an oligomer or a cage structure comprising the structure A5:

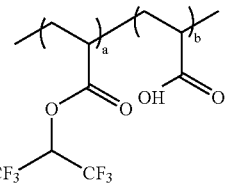

A5 wherein $A_5$ is a polymer, oligomer or cage structure wherein;

$X_8$ selected from the group consisting of linear, branched, or cyclic alkylene, linear, branched or cyclic heteroalkylene, dicarboxyl, and dicarbonyl;

$R_{17}$ is selected from H, carboxylic acid, sulfonamide, fluoroalcohol, or sulfonic acid that is unprotected or partially or fully protected with an acid-labile group;

$R_{18}$ is a nonfluorinated or partially fluorinated or perfluorinated functionality, other than a fluorinated ether, that is acid-labile or non-acid labile; provided one of $R_{17}$ and $R_{18}$ is a fluorocarbyl moiety other than a fluorinated ether; and $n_{13}$ is an integer greater than or equal to 2.

The present invention is also directed to additives including a compound having one of the following structures:

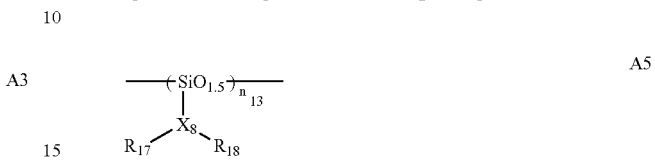

wherein a:b=0-100 mole %:100-0 mole %, and a+b=100 mole %; as exemplified by:

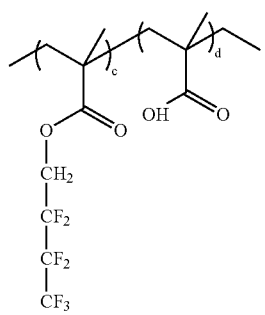

Polymer 1 (a:b = 50:50)
Polymer 2 (a:b = 60:40)
Polymer 3 (a:b = 70:30)
Polymer 4 (a:b = 80:20)
Polymer 5 (a:b = 90:10)
Polymer 6 (a:b = 100:0)

wherein c:d=0-100 mole %:100-0 mole %, and c+d=100 mole %; as exemplified by:

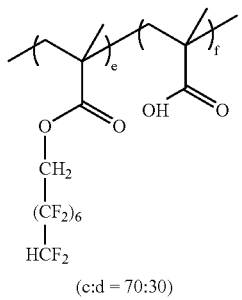

Polymer 7

(c:d = 70:30)

wherein e:f=0-100 mole %:100-0 mole %, and e+f=100 mole %; as exemplified by:

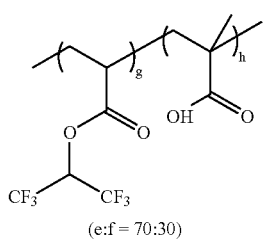

Polymer 8

(e:f = 70:30)

wherein g:h=0-100 mole %:100-0 mole %, and g+h=100 mole %; as exemplified by:

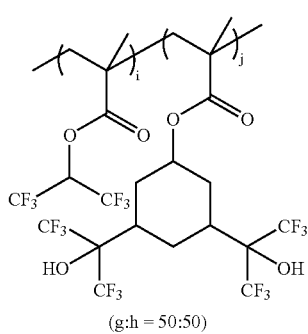

Polymer 9

(g:h = 50:50)

wherein i:j=0-100 mole %:100-0 mole %, and i+j=100 mole %; as exemplified by:

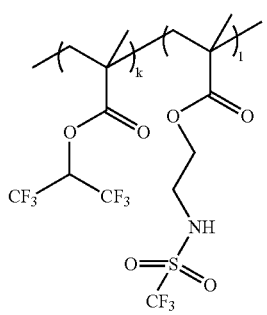

Polymer 10 (i:j = 50:50)
Polymer 11 (i:j = 40:60)
Polymer 12 (i:j = 30:70)

wherein k:l=0-100 mole %:100-0 mole %, and k+l=100 mole %; as exemplified by:

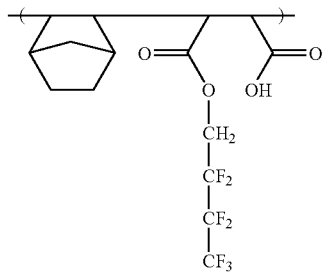

Polymer 13 (k:l = 50:50)
Polymer 14 (k:l = 40:60)
Polymer 15 (k:l = 30:70)

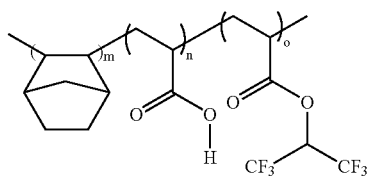

Polymer 16 wherein m:n:o=0-100 mole %:100-0 mole %:0-100 mole %, and m+n+o=100 mole %;

as exemplified by:

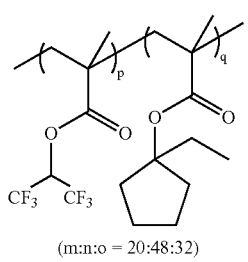

Polymer 17

(m:n:o = 20:48:32)

wherein p:q=0-100 mole %:100-0 mole %, and p+q=100 mole %; as exemplified by:

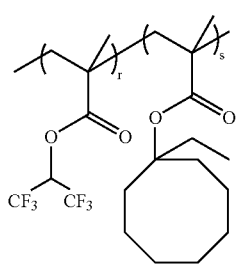

Polymer 18 (p:q = 50:50)
Polymer 19 (p:q = 30:70)

wherein r:s=0-100 mole %:100-0 mole %, and r+s=100 mole %; as exemplified by:

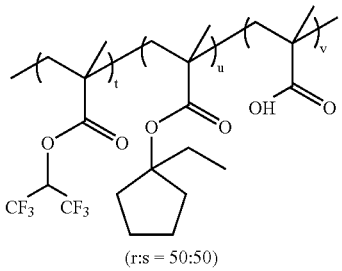

Polymer 20

(r:s = 50:50)

wherein t:u:v=0-100 mole %:100-0 mole %:0-100 mole %, and t+u+v=100 mole %;
as exemplified by:

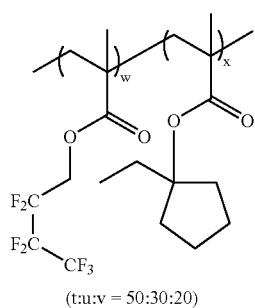

Polymer 21

(t:u:v = 50:30:20)

wherein w:x=0-100 mole %:100-0 mole %, and w+x=100 mole %; as exemplified by:

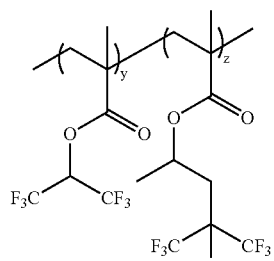

Polymer 22 (w:x = 50:50)
Polymer 23 (w:x = 30:70)

wherein y:z=0-100 mole %:100-0 mole %, and y+z=100 mole %; as exemplified by:

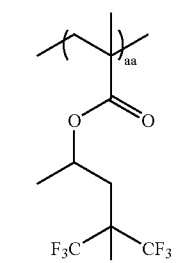

Polymer 24 (y:z = 20:80)
Polymer 25 (y:z = 5:95)

-continued

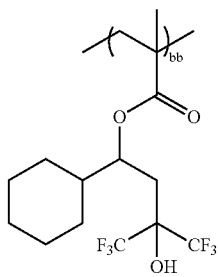

Polymer 26

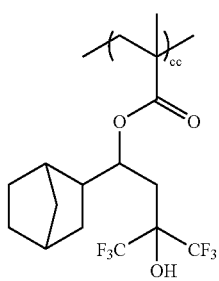

Polymer 27

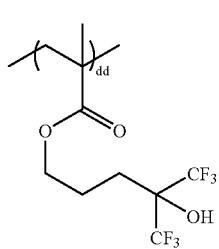

Polymer 28

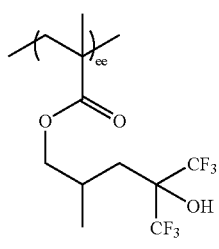

Polymer 29

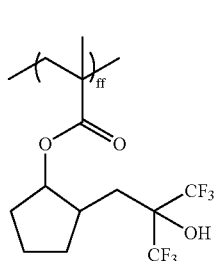

Polymer 30

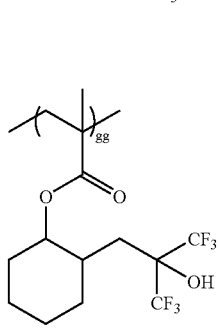

Polymer 31

-continued

Polymer 32

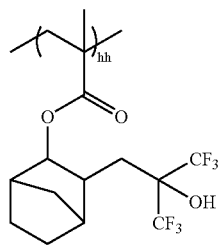

Polymer 33

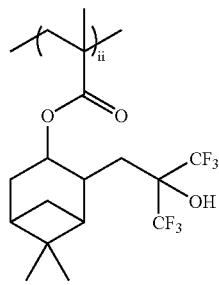

Polymer 34

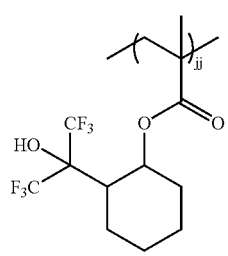

Polymer 35

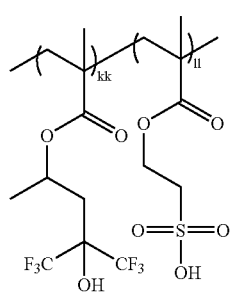

wherein kk:ll=0-100 mole %:100-0 mole %, and kk+ll=100 mole %; as exemplified by:

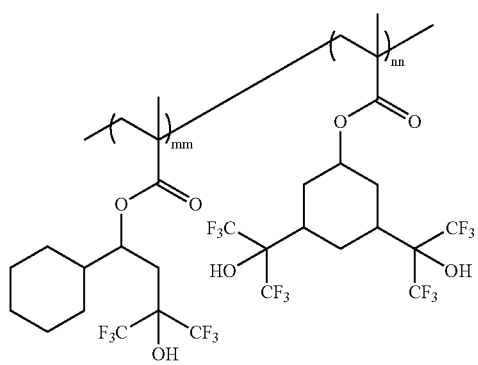

Polymer 36 (kk:ll = 99:1)
Polymer 37 (kk:ll = 97.5:2.55)
Polymer 38 (kk:ll = 95:5)

wherein mm:nn=0-100 mole %:100-0 mole %, and mm+nn=100 mole %; as exemplified by:

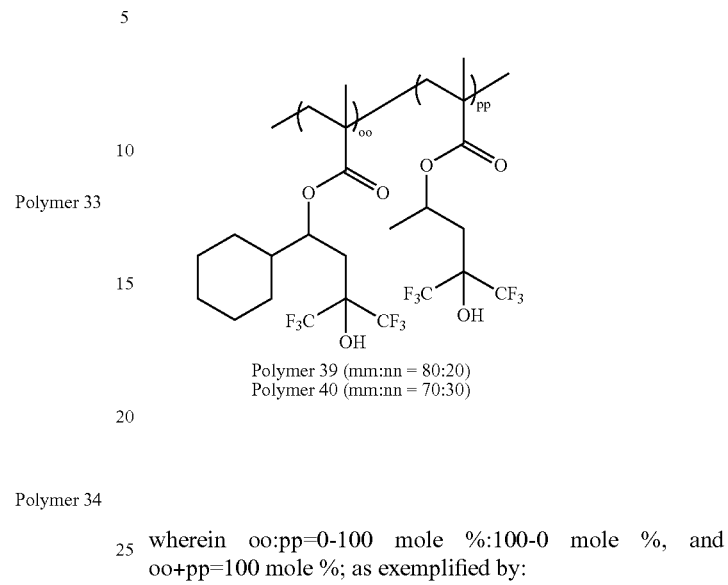

Polymer 39 (mm:nn = 80:20)
Polymer 40 (mm:nn = 70:30)

wherein oo:pp=0-100 mole %:100-0 mole %, and oo+pp=100 mole %; as exemplified by:

Polymer 41

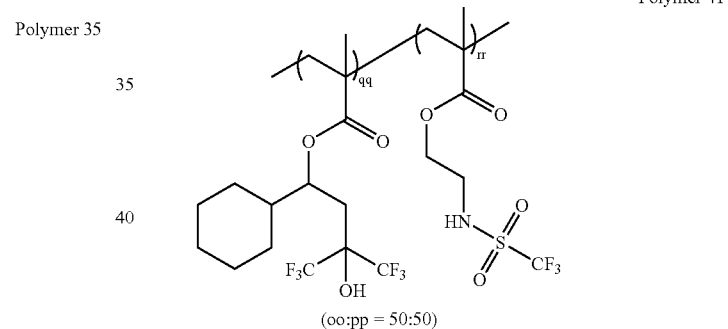

(oo:pp = 50:50)

wherein qq:rr=0-100 mole %:100-0 mole %, and qq+rr=100 mole %; as exemplified by:

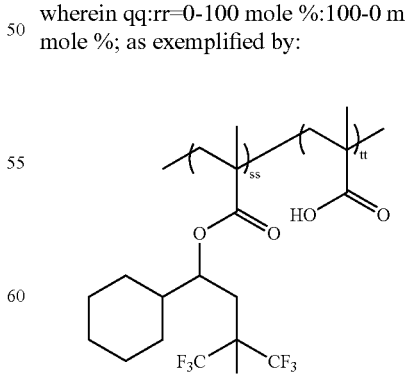

Polymer 42 (qq:rr = 80:20)
Polymer 43 (qq:rr = 70:30)

wherein ss:tt=0-100 mole %:100-0 mole %, and ss+tt=100 mole %; as exemplified by:

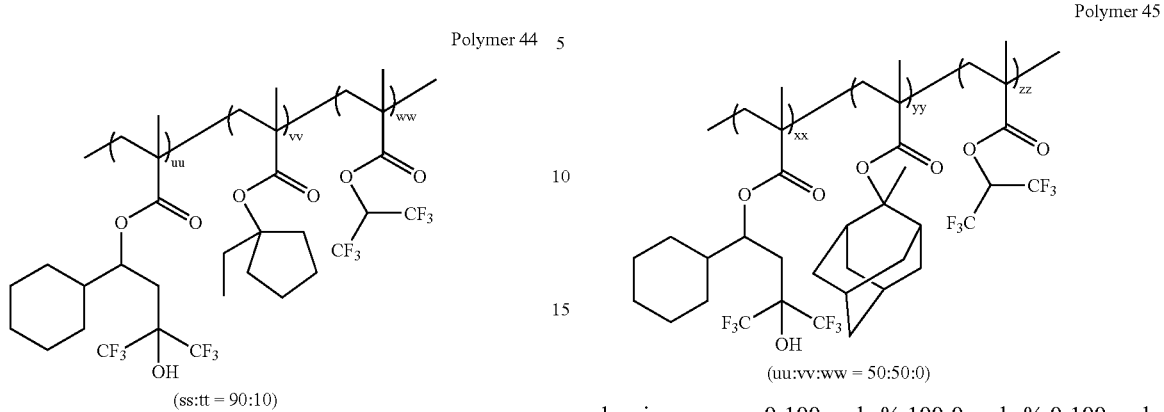

Polymer 44

(ss:tt = 90:10)

wherein uu:vv:ww=0-100 mole %:100-0 mole %:0-100 mole %, and uu+vv+ww=100 mole %; as exemplified by:

Polymer 45

(uu:vv:ww = 50:50:0)

wherein xx:yy:zz=0-100 mole %:100-0 mole %:0-100 mole %, and xx+yy+zz=100 mole %; as exemplified by:
Polymer 46 (xx:yy:zz=50:50:0)
wherein a, b, c, ... z, and aa, bb, cc, ... zz each represent a number of repeat units.

The present invention is also directed to additives including a cage compound having the following structure:

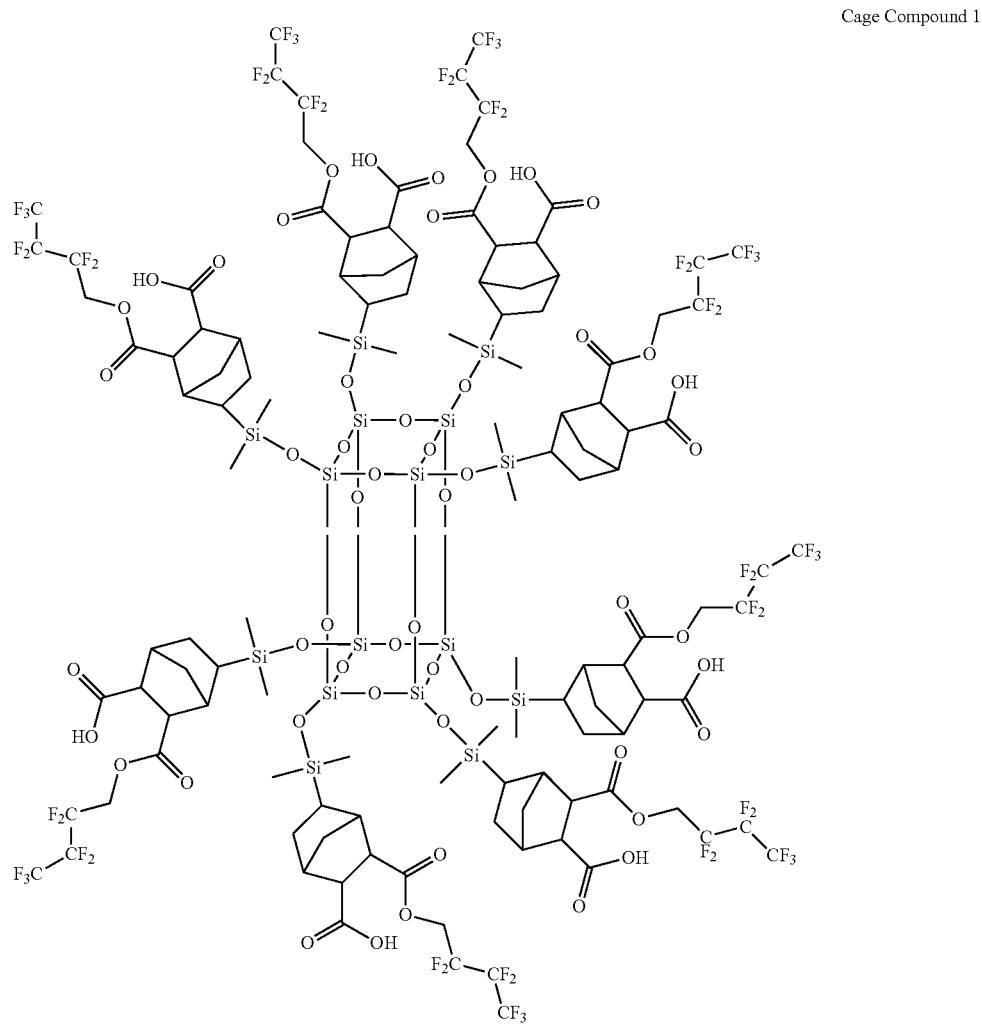

Cage Compound 1

The inventive compound has a high surface activity. In another embodiment, the instant compound has a high water contact angle.

The additive compounds of this invention may be used in combination with any desired resist material in the forming of a lithographic structure. Preferably, the resist is a chemical amplification resist that is imageable with shorter wavelength ultraviolet radiation (e.g., <200 nm wavelength) or with extreme ultraviolet radiation (EUV) or electron beam radiation. Examples of suitable chemically amplified resists are described in H. Ito, "Chemical Amplification Resists for Microlithography," Advances in Polymer Science, Vol. 172, pp. 37-245, 2005. The additive compound of this invention may constitute about 0.01 percent by weight to about 20 percent by weight of the solid contents of the resist formulation. Preferably, the additive compound is less than 5 percent by weight of the solid contents of the resist formulation.

The resist polymer or oligomer in the resist composition can represent up to about 99 percent by weight of the solids included in the composition, and the photoacid generator can represent approximately 0.1 percent by weight to 25 percent by weight of the solids contained in the resist composition.

Typical polymers used in resist formulations include acrylates, methacrylates, cycloolefin polymers, cycloolefin maleic anhydride copolymers, cycloolefin vinyl ether copolymers, siloxanes, silsesquioxanes, carbosilanes. The oligomers include polyhedral oligomeric silsesquioxanes, carbohydrates, and other cage compounds. These polymers or oligomers are appropriately functionalized with aqueous base soluble groups, acid-labile groups, polar functionalities, silicon containing groups as needed.

The photoacid generator may be any compound that, upon exposure to radiation, generates a strong acid and is compatible with the other components of the photoresist composition. Examples of preferred photochemical acid generators (PAGs) include, but are not limited to, sulfonates, onium salts, aromatic diazonium salts, sulfonium salts, diaryliodonium salts and sulfonic acid esters of N-hydroxyamides or N-hydroxyimides, as disclosed in U.S. Pat. No. 4,731,605. Any PAG(s) incorporated into the present photoresists should have high thermal stability, i.e., be stable to at least 140° C., so they are not degraded during pre-exposure processing.

Any suitable photoacid generator can be used in the photoresist compositions of the invention. Typical photoacid generators include, without limitation:

(1) sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride;

(2) halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, bis-(t-butylphenyl)iodonium triflate, and bis-(t-butylphenyl)-iodonium camphanylsulfonate;

(3) α,α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl)diazomethane, and bis(cyclohexylsulfonyl) diazomethane;

(4) trifluoromethanesulfonate esters of imides and hydroxyimides, e.g., α-(trifluoromethylsulfonyloxy)-bicyclo[2.2.1] hept-5-ene-2,3-dicarboximide (MDT);

(5) nitrobenzyl sulfonate esters such as 2-nitrobenzyl p-toluenesulfonate, 2,6-dinitrobenzyl p-toluenesulfonate, and 2,4-dinitrobenzyl p-trifluoromethylbenzene sulfonate;

(6) sulfonyloxynaphthalimides such as N-camphorsulfonyloxynaphthalimide and N-pentafluorophenylsulfonyloxynaphthalimide;

(7) pyrogallol derivatives (e.g., trimesylate of pyrogallol);

(8) naphthoquinone-4-diazides;

(9) alkyl disulfones;

(10) s-triazine derivatives, as described in U.S. Pat. No. 4,189,323; and miscellaneous sulfonic acid generators including t-butylphenyl-α-(p-toluenesulfonyloxy)-acetate, t-butyl-α-(p-toluenesulfonyloxy)acetate, and N-hydroxy-naphthalimide dodecane sulfonate (DDSN), and benzoin tosylate.

Other suitable photoacid generators are disclosed in Reichmanis et al. (1991), Chemistry of Materials 3:395, and in U.S. Pat. No. 5,679,495 to Yamachika et al. Additional suitable acid generators useful in conjunction with the compositions and methods provided herein will be known to those skilled in the art and/or are described in the pertinent literature.

A dissolution modifying additive, generally although not necessarily a dissolution inhibitor, is typically included. If a dissolution inhibitor is present, it will typically be represented in the range of about 1 percent by weight to 40 percent by weight, preferably about 5 percent by weight to 30 percent by weight of the total solids.

Preferred dissolution inhibitors have high solubility in the resist composition and in the solvent used to prepare solutions of the resist composition (e.g., propylene glycol methyl ether acetate, or "PGMEA"), exhibit strong dissolution inhibition, have a high exposed dissolution rate, are substantially transparent at the wavelength of interest, may exhibit a moderating influence on $T_g$, strong etch resistance, and display good thermal stability (i.e., stability at temperatures of about 140° C. or greater). Suitable dissolution inhibitors include, but are not limited to, bisphenol A derivatives, e.g., wherein one or both hydroxyl moieties are converted to a t-butoxy substituent or a derivative thereof such as a t-butoxycarbonyl or t-butoxycarbonylmethyl group; fluorinated bisphenol A derivatives such as $CF_3$-bisphenol A-OCH$_2$(CO)—O-tBu (6F-bisphenol A protected with a t-butoxycarbonylmethyl group); normal or branched chain acetal groups such as 1-ethoxyethyl, 1-propoxyethyl, 1-n-butoxyethyl, 1-isobutoxy-ethyl, 1-t-butyloxyethyl, and 1-t-amyloxyethyl groups; and cyclic acetal groups such as tetrahydrofuranyl, tetrahydropyranyl, and 2-methoxytetrahydro-pyranyl groups; androstane-17-alkylcarboxylates and analogs thereof, wherein the 17-alkylcarboxylate at the 17-position is typically lower alkyl. Examples of such compounds include lower alkyl esters of cholic, ursocholic and lithocholic acid, including methyl cholate, methyl lithocholate, methyl ursocholate, t-butyl cholate, t-butyl lithocholate, t-butyl ursocholate, and the like (see, e.g., Allen et al. (1995) J. Photopolym. Sci. Technol., cited supra); hydroxyl-substituted analogs of such compounds (ibid.); and androstane-17-alkylcarboxylates substituted with one to three $C_1$-$C_4$ fluoroalkyl carbonyloxy substituents, such as t-butyl trifluoroacetyllithocholate (see, e.g., U.S. Pat. No. 5,580,694 to Allen et al.).

The remainder of the resist composition is composed of a solvent and may additionally, if necessary or desirable, include customary additives such as dyes, sensitizers, additives used as stabilizers, dissolution modifying additives, and acid-diffusion controlling agents, basic compounds, coating aids such as surfactants or anti-foaming agents, crosslinking agents, photospeed control agents, adhesion promoters and plasticizers.

The choice of solvent is governed by many factors not limited to the solubility and miscibility of resist components, the coating process, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. See, e.g., Introduction to Microlithography, Eds. Thompson et al., cited previously. In addition to the above components, the photoresist compositions provided herein generally include a casting solvent to dissolve the other components so that the overall composition may be applied evenly on the substrate surface to provide a defect-free coating. Where the photoresist composition is used in a multilayer imaging process, the solvent used in the imaging layer photoresist is preferably not a solvent to the underlayer materials, otherwise the unwanted intermixing may occur. The invention is not limited to selection of any particular solvent. Suitable casting solvents may generally be chosen from ether-, ester-, hydroxyl-, and ketone-containing compounds, or mixtures of these compounds. Examples of appropriate solvents include carbon dioxide, cyclopentanone, cyclohexanone, ethyl 3-ethoxypropionate (EEP), a combination of EEP and γ-butyrolactone (GBL), lactate esters such as ethyl lactate, alkylene glycol alkyl ether esters such as PGMEA, alkylene glycol monoalkyl esters such as methyl cellosolve, butyl acetate, and 2-ethoxyethanol. Preferred solvents include ethyl lactate, propylene glycol methyl ether acetate, ethyl 3-ethoxypropionate and their mixtures. The above list of solvents is for illustrative purposes only and should not be viewed as being comprehensive nor should the choice of solvent be viewed as limiting the invention in any way. Those skilled in the art will recognize that any number of solvents or solvent mixtures may be used.

Greater than 50 percent of the total mass of the resist formulation is typically composed of the solvent, preferably greater than 80 percent.

Other customary additives include dyes that may be used to adjust the optical density of the formulated resist and sensitizers which enhance the activity of photoacid generators by absorbing radiation and transferring it to the photoacid generator. Examples include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

A wide variety of compounds with varying basicity may be used as stabilizers and acid-diffusion controlling additives. They may include nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene, guanidines, imides, amides, and others. Ammonium salts may also be used, including ammonium, primary, secondary, tertiary, and quaternary alkyl- and aryl-lammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed. Surfactants may be used to improve coating uniformity, and include a wide variety of ionic and non-ionic, monomeric, oligomeric, and polymeric species. Likewise, a wide variety of anti-foaming agents may be employed to suppress coating defects. Adhesion promoters may be used as well; again, a wide variety of compounds may be employed to serve this function. A wide variety of monomeric, oligomeric, and polymeric plasticizers such as oligo- and polyethyleneglycol ethers, cycloaliphatic esters, and non-acid reactive steroidally derived materials may be used as plasticizers, if desired. However, neither the classes of compounds nor the specific compounds mentioned above are intended to be comprehensive and/or limiting. One skilled in the art will recognize the wide spectrum of commercially available products that may be used to carry out the types of functions that these customary additives perform.

Typically, the sum of all customary additives will comprise less than 20 percent of the solids included in the resist formulation, preferably, less than 5 percent.

In one embodiment, the substrate composition mentioned above further comprises a topcoat applied to the photoresist layer.

Another aspect of the invention relates to an electronics device fabricated from the substrate described above.

The present invention also relates to a computer comprising the electronics device mentioned above.

The inventive material is preferably substantially optically transparent to an appropriate exposure radiation for the underlying photoresist material, to allow patterning of the photoresist material.

The present invention, as mentioned above, is also directed to additives which have a low surface energy, i.e., high contact angle. The structures presented above have been characterized for static, advancing and receding contact angles.

EXAMPLES

The following examples are intended to provide those of ordinary skill in the art with a complete disclosure and description of how to prepare and use the compositions disclosed and claimed herein. Efforts have been made to ensure accuracy with respect to measured numbers, but allowance should be made for the possibility of errors and deviations. Unless indicated otherwise, parts are parts by weight, temperature is in ° C. and pressure is at or near atmospheric. Polyhedral oligomeric silsesquioxane derivatives were obtained from Hybrid Plastics. Bis(hexafluoro-2-hydroxy-2-propyl)cyclohexyl methacrylate, 1-cyclohexyl-4,4,4-trifluoro-3-hydroxy-3-(trifluoromethyl)butyl methacrylate, and 2-(1,1,1,3,3,3-hexafluoro-2-hydroxypropan-2-yl)cyclohexyl methacrylate were obtained from Central Glass (Japan). Additionally, all the other starting materials were obtained commercially or were synthesized using known procedures.

Where appropriate, the following techniques and equipment were utilized in the examples: 1H and 13C NMR spectra were obtained at room temperature on an Avance 400 spectrometer. Quantitative 13C NMR was run at room temperature in acetone-d6 in an inverse-gated 1H-decoupled mode using Cr(acac)3 as a relaxation agent on an Avance 400 spectrometer. For polymer composition analysis 19F NMR (379 MHz) spectra were also obtained using a Bruker Avance 400 spectrometer. Thermo-gravimetric analysis (TGA) was performed at a heating rate of 5° C./min in N2 on a TA Instrument Hi-Res TGA 2950 Thermogravimetric Analyzer. Differential scanning calorimetry (DSC) was performed at a heating rate of 10° C./min on a TA Instruments DSC 2920 modulated differential scanning calorimeter. Molecular weights were measured in tetrahydrofuran (THF) on a Waters Model 150 chromatograph relative to polystyrene standards. IR spectra were recorded on a Nicolet 510 FT-IR spectrometer on a film cast on a KBr plate. Optical density or absorbance measurements at 193 nm were performed using a Varian Cary Model 400 spectrometer on multiple thicknesses on quarts wafers. Film thickness was measured on a Tencor alpha-step 2000 or Nanospec. A quartz crystal microbalance (QCM) with a MAXTEC Inc. PLO-10 Phase lock oscillator was used to study the dissolution kinetics of the resist films in an aqueous 0.26N tetramethylammonium hydroxide (TMAH) solution (CD-26). Lithographic evaluation was performed on a 0.6N 193 nm ministepper, dry exposure tool or a 193 nm interferometric exposure tool.

Figure 1B:
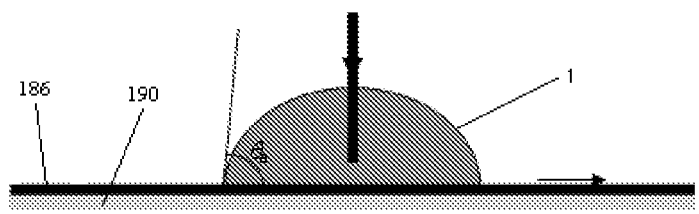
FIG. 1B and FIG. 1C show how the reported dynamic angles are calculated from an average of 3-5 measurements with the needle inside the droplet as it is increasing in volume ($\theta_a$) and decreasing in volume ($\theta_r$) (0 μl-20 μl) with a controlled rate of 0.1 μl/second, respectively.
Figure 1C:
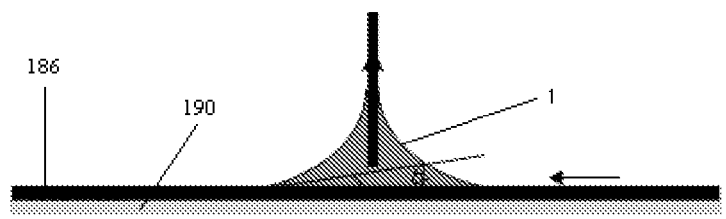
Figure 1D:
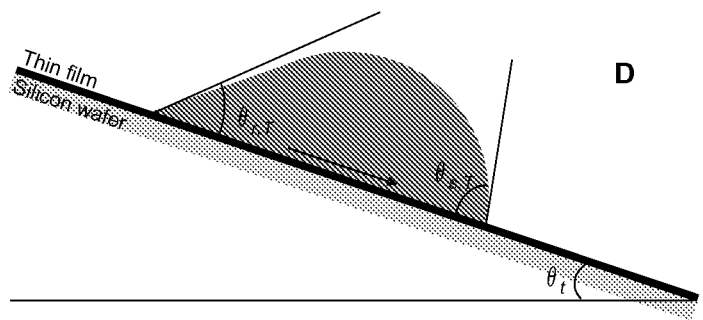
FIG. 1D shows how static advancing ($\theta_{a,T}$) and receding ($\theta_{r,T}$) contact angles are measured with the Tilting Stage setup (T). A 50 μl drop is placed on the substrate, the substrate is thereafter tilted at a controlled rate until the droplet starts moving. The tilt angle ($\theta_t$), $\theta_{a,T}$ and $\theta_{r,T}$ are measured just before the drop starts moving. The presented numbers are calculated from and average of 3-5 separate measurements.

Contact angles were measured on an OCA video based contact angle system from FDS Future Digital Scientific Corporation, using the sessile drop method. The advancing and receding contact angles were measured using two different setups: the Captive Drop (C) and/or the Tilting Stage (T). In the present invention we present the a) Static contact angle ($\theta e$), b) Advancing contact angle according to Captive Drop ($\theta a$, C) or Tilting stage setup ($\theta a$, T) and c) Receding contact angle according to the Captive Drop ($\theta r$, C) or Tilting Stage setup ($\theta r$, T). FIG. 1A shows the static contact angle to be the angle when all participating phases (i.e. air, water and resist film) have reached their natural equilibrium positions and the three phase line is not moving. Reported are static contact angles with a calculated average from 5-10 measurements of a 2 µl ionized water drop. Advancing and Receding contact angles measured with the captive drop setup (also called dynamic contact angles) are measured when the three phase line is in controlled motion by wetting the sample or by withdrawing the water over a pre-wetted surface, respectively. FIG. 1B and FIG. 1C show how dynamic contact angles are measured with the Captive Drop setup (C). The presented numbers are calculated from an average of 3-5 measurements with the needle inside the droplet as it is increasing in volume ($\theta a$, C) and decreasing in volume ($\theta r$, C) (0 µl-20 µl) with a controlled rate of 0.1 µl/second, respectively. FIG. 1D shows how advancing ($\theta a$, T) and receding ($\theta r$, T) static contact angles are measured with the Tilting Stage setup (T). A 50 µl drop is placed on the substrate, the substrate is thereafter tilted until the droplet starts moving. The tilt angle ($\theta t$), $\theta a$, T and $\theta r$, T are measured just before the drop starts moving. The presented numbers are calculated from and average of 3-5 separate measurements.

One of the main objectives of using a topcoat is to prevent leaching of extractables from the resist into the immersion liquid. Extraction of resist components into water was performed using WEXA (Water Extraction Apparatus, see R. D. Allen et. al., J. Photopolym. Sci. & Tech., 2005, 18 (5), 615-619). Selected materials in the present invention were set in contact with water in a controlled reproducible manner (time, speed, volume, contact area etc.). The water was thereafter collected and analyzed for extractables by Exygen Research using LC/MS/MS. Reported are the amount sulfonate extractables originating from the PAG (photo acid generator) that is a component of the resist. For ease of understanding, the amount is reported as percent extractable reduction using an additive covered by the present invention as compared to without using an additive. In all cases, the extractables were much lower after the addition of additive to the resist.

Example 1

Synthesis of Poly(1,1,1,3,3,3,-hexafluoroisopropyl methacrylate-co-methacrylic acid) (Polymer 1)

1,1,1,3,3,3,-hexafluoroisopropyl methacrylate (4.72 grams, 0.02 mole), methacrylic acid (1.72 grams, 0.02 mole) and 20 grams of tetrahydrofuran (THF) were placed in a round bottom flask equipped with a condenser and a nitrogen inlet. 2,2'-Azobisisobutyronitrile (AIBN) (0.26 grams, 0.0016 moles) and 1-dodecanethiol (0.24 grams, 0.0012 moles) were added to this solution and stirred until dissolved. The solution was then degassed using four vacuum/nitrogen purges. The contents were then heated to reflux for 18 hours. Afterwards, the solution was added dropwise into hexanes (500 ml). The precipitated polymer was filtered (frit), washed twice with hexanes (50 ml) and dried under vacuum at 60° C. Yield: 5.2 grams. Mn=4,721. Polydispersity 1.55. Tg: 150° C.

Examples 2-15

Synthesis of Polymers 2-15

These polymers were synthesized by the same procedure described for Polymer 1, starting with appropriate monomers in required quantities.

Example 16

Synthesis of Poly(norbornane-alt-maleic acid 4,4,5,5,5-pentafluoro-1-pentanol monoester) Topcoat (Polymer 16)

a. Synthesis of Norbornene-alt-maleic anhydride copolymer: Example X: Synthesis of Poly(norbornene-alt-maleic anhydride—V601 initiator). A mixture of norbornene (37.66 g; 0.4 moles), maleic anhydride (39.22 g; 0.4 moles), 80 g ethyl acetate, and 80 g tetrahydrofuran were heated to reflux in a 500 mL round-bottom flask with stirring under a nitrogen atmosphere. The mixture was cooled slightly, and dimethyl 2,2'-azobisisobutyrate (V-601) (3.68 g; 16 mmol) was added all in one portion. The mixture was nitrogen flushed and heated to reflux under nitrogen for 19 hours. The reaction mixture was cooled to room temperature, diluted with 100 mL of tetrahydrofuran, then precipitated into 3 liters of stirred 2-propanol. The resulting solid was collected, washed with three 150 mL portions of 2-propanol and residual solvent removed under vacuum (100 milliTorr) to obtain a constant weight. A yield of 74.65 grams of a white polymer powder was obtained.

b. Norbornene-alt-maleic anhydride copolymer (above) (1.0 g) was heated in a 100 mL flask with 9 grams of 4,4,5,5,5-pentafluoro-1-pentanol and 50 mg of 4-dimethylaminopyridine, at reflux, under nitrogen for 21 hours. The reaction mixture was cooled, stirred with 0.5 g of Amberlyst-15 for 2.5 hours, and the solution was filtered through glass wool. This solution was diluted with 5.9 g of n-butanol and filtered through 0.2 micron PTFE filter.

Example 17

Synthesis of Terpolymer

Polymer 17

Norbornene (4.70 grams, 0.05 mole), acrylic acid (2.16 grams, 0.030 mole), 1,1,1,3,3,3,-hexafluoroisopropyl methacrylate (4.44 grams, 0.020 mole) and 12 grams of ethyl acetate were placed in a round bottom flask equipped with a condenser and a nitrogen inlet. 2,2'-Azobisisobutyronitrile (AIBN) (0.65 grams, 0.004 mole) was added to this solution and stirred until dissolved. The solution was then degassed using four vacuum/nitrogen purges. The contents were then heated to reflux for 18 hours. Afterwards, the solution was added dropwise into hexanes (500 ml). The precipitated polymer was filtered (frit), washed twice with hexanes (50 ml) and dried under vacuum at 60° C. Yield 6.1 grams. Composition: 20/48/32 by Inverse Gated $^{13}$C NMR, Mn=4,180. Polydispersity 2.05.
Tg: 137° C.

Examples 18-21

Synthesis of Polymers 18-21

These polymers were synthesized by the same procedure described for Polymer 1, starting with appropriate monomers in required quantities.

Examples 22-46

Synthesis of Polymers 22-46

These polymers were synthesized by the same procedure described for Polymer 1, starting with appropriate monomers in required quantities.

Example 47

Synthesis of Cage Compound 1

Octakis(dimethylsilyloxy)silsesquioxane (Q8M8H) (2.54 grams, 0.0025 mole), cis-5-norbornene-endo-2,3-dicarboxylic anhydride (3.28 g, 0.020 mole), and tetrahydrofuran (THF) (20 ml) were placed in a round bottom flask equipped with a magnetic stirrer, nitrogen inlet, and a water condensor. Platinum(0)-1,3-divinyl-1,1,3,3-tetramethyldisiloxane complex in xylene (1 ml) was added to this mixture and stirred at room temperature for 1 hour and heated to reflux for 1 more hour. According to the IR spectrum of the reaction product, the reaction was complete. The solvent was removed in a rotary evaporator and the residue was dried under vacuum at room temperature.
b. To the above solid, 2,2,3,3,4,4-heptafluoro-1-butanol (42.75 g), dimethylamino pyridine (DMAP) (50 mg) were added and heated to reflux for 16.5 hours. This solution was stirred with Amberlist 15 (washed, 2 g) for 5 hours and filtered through a 0.2 micron syringe filter.

Example 48

Contact Angle Evaluation

Polymer 1 to Polymer 21 and Cage compound 1 were each added to a commercial resist formulation, Resist A. 13.4 mg additive in 4 g of Resist A resulted in an effective additive content of 5 wt % (Resist A contains 6.7 wt % solids). The three solutions were each spin coated on 1 inch silicon wafers and post apply baked at 110° C. for 90 seconds, giving 110 nm thin films. Contact angles were measured as described above using the captive drop setup for advancing and receding. The static and receding contact angles are listed in Table 1. It can be seen that the angle is increased considerably by adding any of the additives at 5 w %.

TABLE 1

Examples of contact angles of Resist A with and without additives as presented in the invention.

| Additive | Static ($\theta_e$) | Receding ($\theta_{r,c}$) |
| --- | --- | --- |
| No additive | 74.1 | 58.0 |
| Polymer 1 | 97.1 | 48.9 |
| Polymer 2 | 98.0 | 54.7 |
| Polymer 3 | 99.7 | 62.7 |
| Polymer 4 | 101.6 | 73.8 |
| Polymer 5 | 104.7 | 79.9 |
| Polymer 6 | 106.5 | 90.1 |
| Polymer 7 | 101.9 | 60.0 |
| Polymer 8 | 100.1 | 65.5 |
| Polymer 10 | 87.8 | 69.4 |
| Polymer 11 | 83.6 | 66.8 |
| Polymer 12 | 80.6 | 64.9 |
| Polymer 13 | 92 | 69.3 |
| Polymer 14 | 86.5 | 63.8 |
| Polymer 15 | 82.3 | 60.9 |
| Polymer 18 | 102.6 | 88 |
| Polymer 19 | 99.4 | 85.4 |
| Polymer 20 | 102.8 | 85.3 |
| Polymer 21 | 98.7 | 73.7 |
| Cage Compound 1 | 77.7 | 58.8 |

Example 49

Contact Angle Evaluation

Polymer 2 to Polymer 45 were either dissolved at 5% solids content in 4-Methyl-2-Pentanol as polymer and/or added to a commercial resist formulation similarly to example 48 at 5% effective additive content. The polymer solutions were each spin coated on 2 inch silicon wafers and post apply baked at 90° C. for 60 seconds. The resist solutions with polymer additives were similarly spin coated on 2 inch silicon wafers but baked at 110° C. for 90 seconds. Advancing and receding contact angles were measured according to the tilting stage setup described above. The static and receding angles are listed in Table 2. It can be noted that similar results are achieved for the same polymer, either formulated in a resist formulation or as a polymer film. This is an indication that the material in the present invention is surface active and dominates the surface also in the resist.

TABLE 2

Examples of water contact angles of polymers in present invention, Measurement of materials both as polymer films and as additives in Resist A. Receding angle is measured by the tilting stage setup.

| | Polymer only | | As additive in Resist A | |
| --- | --- | --- | --- | --- |
| | $\theta_e$ | $\theta_{r,T}$ | $\theta_e$ | $\theta_{r,T}$ |
| Polymer 22 | | | | 77.0 |
| Polymer 23 | | | | 76.3 |

TABLE 2-continued

Examples of water contact angles of polymers in present invention, Measurement of materials both as polymer films and as additives in Resist A. Receding angle is measured by the tilting stage setup.

|  | Polymer only | | As additive in Resist A | |
|---|---|---|---|---|
|  | $\theta_e$ | $\theta_{r,T}$ | $\theta_e$ | $\theta_{r,T}$ |
| Polymer 24 | 87.9 | 69.4 | | |
| Polymer 25 | 85.4 | 67.6 | | |
| Polymer 26 | 82.9 | 65.6 | 81.9 | 65.0 |
| Polymer 27 | 95.9 | 78.7 | 94.9 | 80.8 |
| Polymer 28 | 94.5 | 83.0 | 93.7 | 79.6 |
| Polymer 29 | 71.0 | 50.1 | | |
| Polymer 30 | | | 75.3 | 57.8 |
| Polymer 31 | | | 81.6 | 63.5 |
| Polymer 32 | | | 82.5 | 68.0 |
| Polymer 33 | 83.5 | 70.2 | 86.8 | 73.9 |
| Polymer 34 | 95.1 | 82.4 | | |
| Polymer 35 | 84.7 | 71.6 | 81.9 | 69.0 |
| Polymer 36 | 75.9 | 53.3 | | |
| Polymer 37 | 78.2 | 60.6 | | |
| Polymer 38 | 79.9 | 63.7 | | |
| Polymer 39 | 87.3 | 72.8 | | |
| Polymer 40 | 83.3 | 70.6 | | |
| Polymer 41 | 89.1 | 74.2 | 88.4 | 73.6 |
| Polymer 42 | 91.8 | 73.5 | | |
| Polymer 43 | 90.3 | 71.3 | | |
| Polymer 44 | 91.6 | 75.3 | | |
| Polymer 45 | | | 93.7 | 79.6 |

Example 49

Extraction Evaluation

Selected additives from present invention were evaluated for extraction of sulfonates originating from the photo acid generator. For comparison the materials were not only used as additives, as described by the present invention, but also as conventional topcoats. The conventional topcoat formulations were prepared by dissolving Polymer 1, Polymer 22 and Cage compound 1 in 4-Methyl 2-Pentanol giving 3 wt % solutions. Six resist formulations described in the present invention were prepared also by adding 13.4 mg and 26.8 mg each of Polymer 1, Polymer 22 and Cage compound 1 to 4 g of a commercial 193 nm resist (Resist A) solution respectively. This gave five formulations with effective 5% and 10% additive content. Polymer 22 was not mixed at 5%.

Four 5 inch silicon wafers were coated with 110 nm thick film of a commercial 193 nm positive resist (Resist A). All four wafers were post apply baked at 110° C. for 90 seconds (PAB). Topcoat formulation of Polymer 1, Polymer 22 and Cage compound 1, prepared as described above, were each spin coated over the resist coated wafer, leaving one wafer with resist only. The topcoat formulations were thereafter baked at 90° C. for 60 seconds. Five 5 inch silicon wafers were thereafter spincoated with additive formulations as described above and baked at 110° C. for 90 seconds. All nine wafers were thereafter placed into the WEXA tool and the water was analyzed for sulfonate extractables. Table 3 shows the remaining amount of leached extractables from the resist as compared to not using topcoat. In most cases the additive approach as described by the present invention is as effective as conventional topcoating.

TABLE 3

Extraction effect of using topcoats compared with additives as presented in present invention.

| Sample | Remaining amount of Sulfonate |
|---|---|
| Resist A only | 100% |
| Resist A with Polymer 1 topcoat | 0% |
| Resist A with Polymer 1 as 5% additive | 70% |
| Resist A with Polymer 1 as 10% additive | 46% |
| Resist A with Polymer 22 topcoat | 0% |
| Resist A with Polymer 22 as 10% additive | 0% |
| Resist A with Cage Compound 1 topcoat | 15% |
| Resist A with Cage Compound 1 as 5% additive | 43% |
| Resist A with Cage Compound as 10% additive | 18% |

Example 50

Contrast Evaluation of a Commercial Resist (Resist A) with Polymer 18 Additive

Resist formulations were prepared by adding 13.4 mg and 26.8 mg of Polymer 18 to 4 g of a 193 nm commercial resist (Resist A) giving two formulations with 5% and 10% additive respectively (Resist A contains 6.7 wt % solids). Two 5 inch silicon wafers with an anti-reflective coating (ARC) were coated with the resist formulations. For comparison one wafer was coated with Resist A without additive. All three wafers were post-apply baked at 110° C. for 90 seconds (PAB) and thereafter exposed open frame (no mask) to create an array of doses at 193 nm and post expose baked at 110° C. for 90 seconds (PEB). The wafers were then developed for 60 seconds in a 0.26 N TMAH developer. The thickness change caused by increased exposure dose was measured and three contrast curves were plotted in FIG. 2. The contrast with and without additives are very similar indicating that there is only small effect of using additive.

Figure 2:
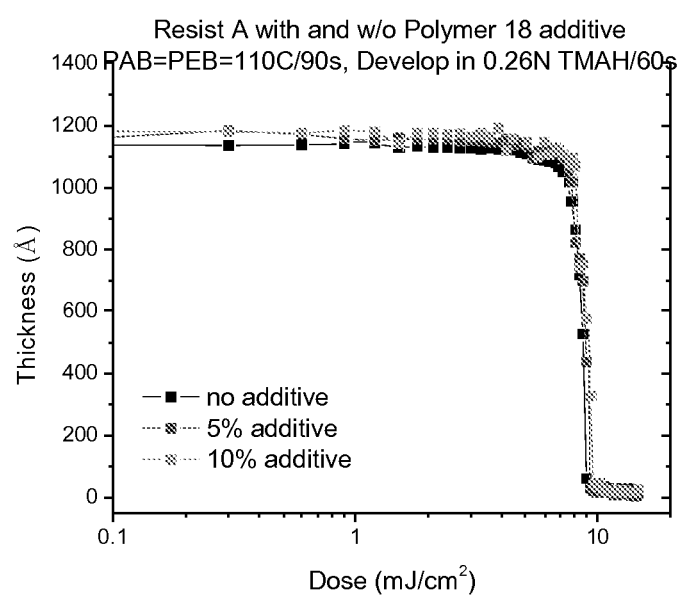
FIG. 2 shows contrast curves of Resist A formulations with and without Polymer 18 additive.

FIG. 2 shows contrast curves of Resist A formulations with and without Polymer 18.

Example 51

Contrast Evaluation of a Commercial 193 nm Resist (Resist A) with Polymer 7 and Polymer 8 as Additives Two resist formulations were prepared by adding 13.4 mg of Polymer 7 and 13.4 mg Polymer 8 to 4 g of a commercial 193 nm resist (Resist A) respectively, giving two formulations with 5% additive (Resist A contains 6.7 wt % solids). Two 5 inch silicon wafers with an anti-reflective coating (ARC) were coated with the resist formulations. For comparison one wafer was coated with Resist A without additive. All three wafers were post-apply baked at 110° C. for 90 seconds (PAB) and thereafter exposed open frame (no mask) to create an array of doses at 193 nm and post expose baked at 110° C. for 90 seconds (PEB). The wafers were then developed for 60 seconds in a 0.26 N TMAH developer. The thickness change caused by increased exposure dose was measured and three contrast curves were plotted in FIG. 3. The contrast with and without additives are very similar indicating that there is only small effect of using additive.

Figure 3:
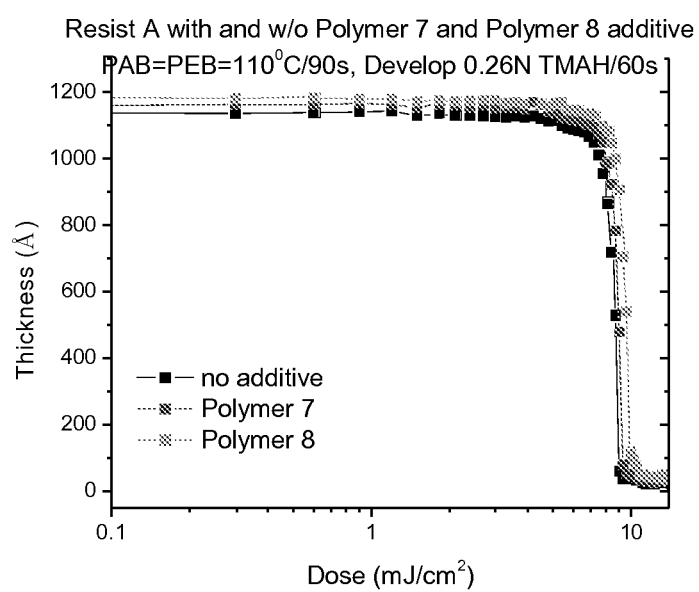
FIG. 3 shows contrast curves of a commercial resist (Resist A) formulations with and without Polymer 7 and Polymer 8 additives.

FIG. 3 shows contrast curves of a commercial resist (Resist A) formulations with and without Polymer 7 and Polymer 8 additives.

Example 52

Lithographic Evaluation of Polymer 22 as Additive to a Commercial 193 nm Resist (Resist A)

A resist formulation was prepared by adding 13.4 mg of Polymer 22 to 4 g of a commercial resist (Resist A) giving a formulation with 5% additive (Resist A contains 6.7 wt % solids). One 5 inch silicon wafer with an anti-reflective coating (ARC) was coated with the resist formulation. For comparison one wafer was similarly coated with Resist A without additive. Both wafers were post-apply baked at 110° C. for 90 seconds (PAB) and thereafter exposed dry through a mask pattern at 193 nm UV light using a 0.6NA microstepper. Both wafers were post expose baked at 110° C. for 90 seconds (PEB) and thereafter developed for 60 seconds in a 0.26 N TMAH developer. High resolution images were obtained shown in FIG. 4A and FIG. 4B. The imaging performance with and without polymer 22 additive is comparable.

Figure 4A:
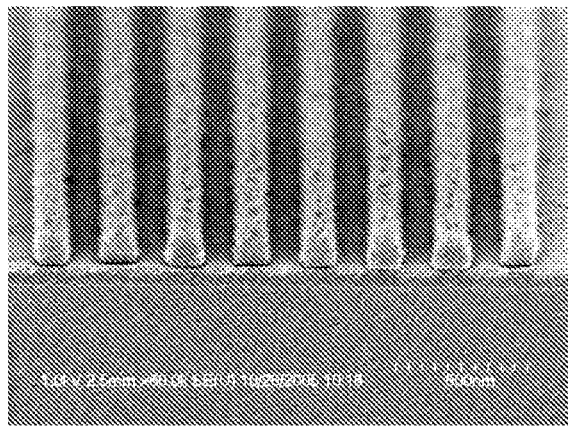
FIGS. 4A and 4B.
Figure 4B:
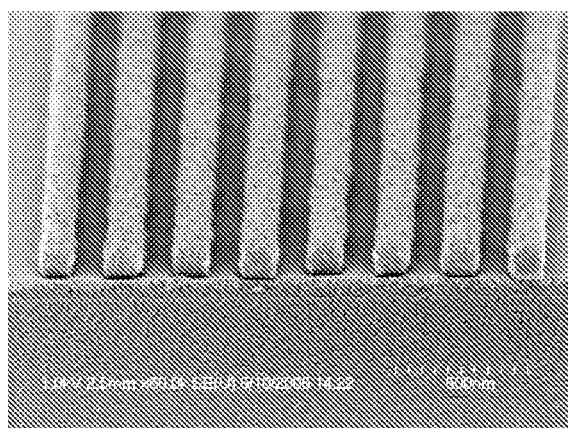

FIGS. 4A and 4B: FIG. 4 shows at 130 nm 1:1 Line/Space arrays, dry exposure at 193 nm of Resist A with Polymer 22 additive (FIG. 4A) and without additive (FIG. 4B).

Example 53

Figure 5:
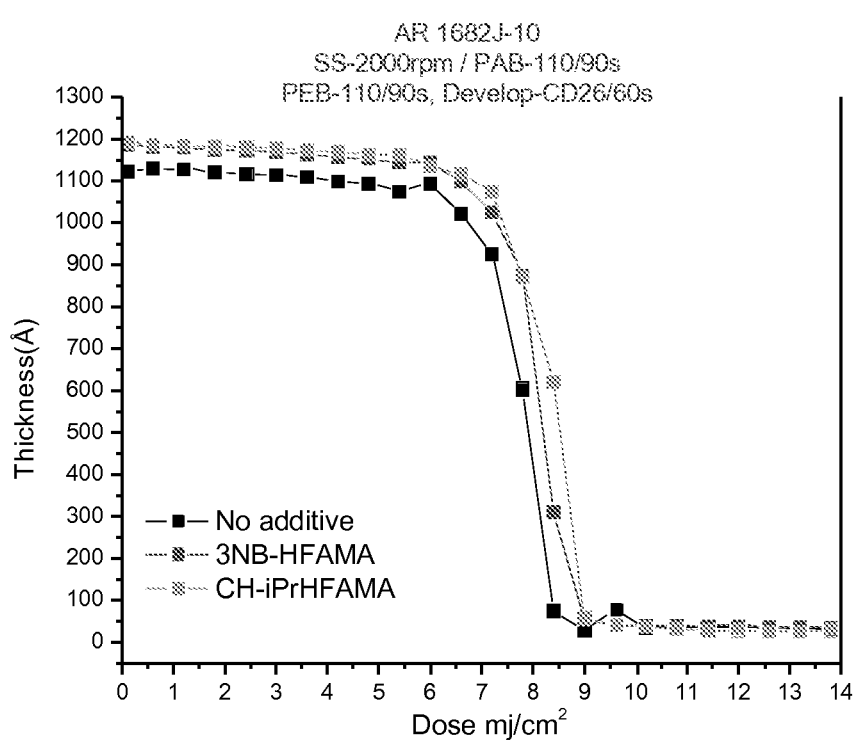
FIG. 5 shows contrast curves of a commercial resist (Resist A) formulations with and without Polymer 27 and Polymer 33 additives.

Contrast Evaluation of a Commercial Resist (Resist A) with and without Polymer 27 and Polymer 33 Additives The experiments were performed according to the same procedure as described in Example 50 and the results are shown in FIG. 5.

FIG. 5: FIG. 5 shows contrast curves of a commercial resist (Resist A) formulations with and without Polymer 27 and Polymer 33 additives.

Example 54

Figure 6:
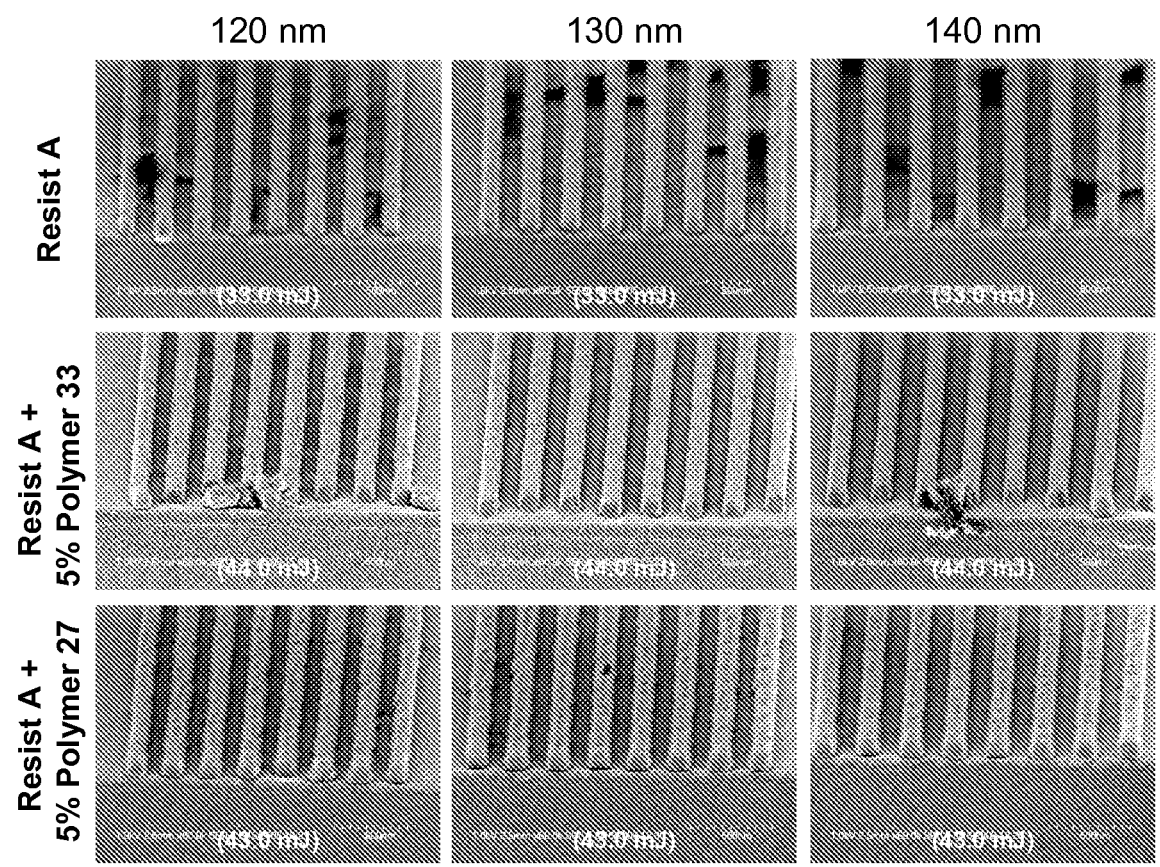
FIG. 6 shows 1:1 Line/Space arrays, dry exposure at 193 nm of Resist A with and without Polymer 27 and Polymer 33 additives.

Lithographic Evaluation of Resist a with and without Polymer 27 and Polymer 33 Additives The experiments were performed according to the same procedure as described in Example 52 and the results are shown in FIG. 6.

FIG. 6: 1:1 Line/Space arrays, dry exposure at 193 nm of Resist A with and without Polymer 27 and Polymer 33 additives.

Example 55

Lithographic Evaluation of Resist A with and without Polymer 27 and Polymer 33 Additives The experiments were conducted according to the same procedure described in Example 52 except a 193 nm interference immersion exposure tool was used instead of the 193 nm dry exposure tool. Water was used as the immersion fluid.

Figure 7:
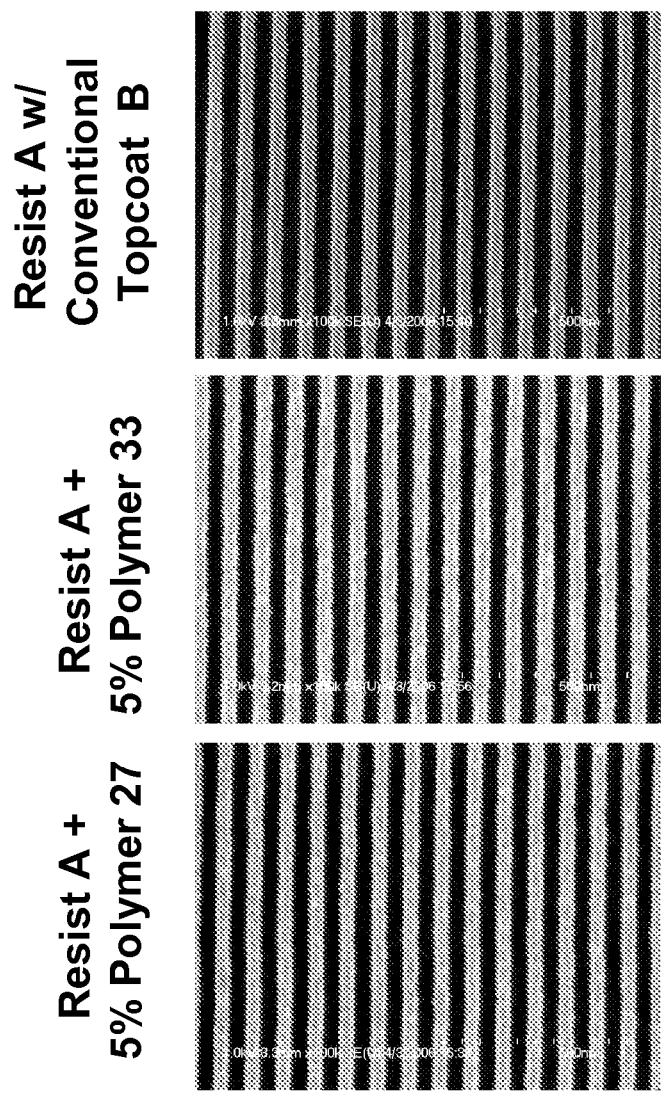
FIG. 7 shows 1:1 Line/Space arrays, interferometric immersion exposure at 193 nm of Resist A with conventional topcoat B and with Polymer 27 and Polymer 33 additives.

FIG. 7: 1:1 Line/Space arrays, interferometric immersion exposure at 193 nm of Resist A with topcoat polymer B and with Polymer 27 and Polymer 33 additives.

Unless otherwise indicated, this invention is not limited to specific compositions, components, or process steps. It should also be noted that the singular forms "a" and "the" are intended to encompass plural referents, unless the context clearly dictates otherwise. The terminology used herein is for the purpose of describing particular embodiments only and is not intended to be limiting.

In this specification and in the claims that follow, reference will be made to a number of terms, which shall be defined to have the following meanings:

As used herein, the phrase "having the formula" or "having the structure" is not intended to be limiting and is used in the same way that the term "comprising" is commonly used.

The term "alkyl" as used herein refers to a linear or branched, saturated hydrocarbon substituent that generally, although not necessarily, contains 1 to about 24 carbon atoms, such as methyl, ethyl, n-propyl, isopropyl, n-butyl, isobutyl, t-butyl, octyl, decyl, tetradecyl, hexadecyl, eicosyl, tetracosyl, and the like. Generally, although again not necessarily, alkyl groups herein contain 1 to about 12 carbon atoms. The term "lower alkyl" intends an alkyl group of 1 to 6 carbon atoms, and the term "cycloalkyl" intends a cyclic alkyl group, typically having 3 to 12, preferably 3 to 8, carbon atoms. The term "substituted alkyl" refers to alkyl substituted with one or more substituent groups, i.e., wherein a hydrogen atom is replaced with a non-hydrogen substituent group, and the terms "heteroatom-containing alkyl" and "heteroalkyl" refer to alkyl substituents in which at least one carbon atom is replaced with a heteroatom such as O, N, or S. If not otherwise indicated, the terms "alkyl" and "lower alkyl" include linear, branched, cyclic, unsubstituted, substituted, and/or heteroatom-containing alkyl and lower alkyl, respectively.

The term "alkylene" as used herein refers to a difunctional linear or branched saturated hydrocarbon linkage, typically although not necessarily containing 1 to about 24 carbon atoms, such as methylene, ethylene, n-propylene, n-butylene, n-hexylene, decylene, tetradecylene, hexadecylene, and the like. Preferred alkylene linkages contain 1 to about 12 carbon atoms, and the term "lower alkylene" refers to an alkylene linkage of 1 to 6 carbon atoms, preferably 1 to 4 carbon atoms. The term "substituted alkylene" refers to an alkylene linkage substituted with one or more substituent groups, i.e., wherein a hydrogen atom is replaced with a non-hydrogen substituent group, and the terms "heteroatom-containing alkylene" and "heteroalkylene" refer to alkylene linkages in which at least one carbon atom is replaced with a heteroatom. If not otherwise indicated, the terms "alkylene" and "lower alkylene" include linear, branched, cyclic, unsubstituted, substituted, and/or heteroatom-containing alkylene and lower alkylene, respectively.

The term "alkoxy" as used herein refers to a group —O-alkyl wherein "alkyl" is as defined above.

The term "alicyclic" is used to refer to cyclic, non-aromatic compounds, substituents and linkages, e.g., cycloalkanes and cycloalkenes, cycloalkyl and cycloalkenyl substituents, and cycloalkylene and cycloalkenylene linkages. Often, the term refers to polycyclic compounds, substituents, and linkages, including bridged bicyclic, compounds, substituents, and linkages. Preferred alicyclic moieties herein contain 3 to about 30, typically 5 to about 14, carbon atoms. Unless otherwise indicated, the term "alicyclic" includes substituted and/or heteroatom-containing such moieties. It will be appreciated that the term "cyclic," as used herein, thus includes "alicyclic" moieties.

The term "heteroatom-containing" as in a "heteroatom-containing alkyl group" (also termed a "heteroalkyl" group) refers to a molecule, linkage or substituent in which one or more carbon atoms are replaced with an atom other than carbon, e.g., nitrogen, oxygen, sulfur, phosphorus or silicon, typically nitrogen, oxygen or sulfur. Similarly, the term "heteroalkyl" refers to an alkyl substituent that is heteroatom-containing, the term "heterocyclic" refers to a cyclic substituent that is heteroatom-containing. Examples of heteroalkyl groups include alkoxyalkyl, alkylsulfanyl-substituted alkyl, and the like.

Unless otherwise indicated, the term "hydrocarbyl" is to be interpreted as including substituted and/or heteroatom-containing hydrocarbyl moieties. "Hydrocarbyl" refers to univalent hydrocarbyl radicals containing 1 to about 30 carbon atoms, preferably 1 to about 18 carbon atoms, most preferably 1 to about 12 carbon atoms, including linear, branched, cyclic, alicyclic, and aromatic species. "Substituted hydrocarbyl" refers to hydrocarbyl substituted with one or more substituent groups, and the terms "heteroatom-containing hydrocarbyl" and "heterohydrocarbyl" refer to hydrocarbyl in which at least one carbon atom is replaced with a heteroatom.

By "substituted" as in "substituted alkyl," and the like, as alluded to in some of the aforementioned definitions, is meant that in the alkyl, or other moiety, at least one hydrogen atom bound to a carbon (or other) atom is replaced with a non-hydrogen substituent. Examples of suitable substituents herein include halo, hydroxyl, sulfhydryl, $C_1$-$C_{12}$ alkoxy, acyl (including $C_2$-$C_{12}$ alkylcarbonyl (—CO-alkyl)), acyloxy (—O-acyl), $C_2$-$C_{12}$ alkoxycarbonyl (—(CO)—O-alkyl), $C_2$-$C_{12}$ alkylcarbonato (—O—(CO)—O-alkyl), carboxy (—COOH), carbamoyl (—(CO)—$NH_2$), mono-substituted $C_1$-$C_{12}$ alkylcarbamoyl (—(CO)—NH($C_1$-$C_{12}$ alkyl)), di-substituted alkylcarbamoyl (—(CO)—N($C_1$-$C_{12}$ alkyl)$_2$), cyano (—C≡N), cyanato (—O—C≡N), formyl (—(CO)—H), amino (—$NH_2$), mono- and di-($C_1$-$C_{12}$ alkyl)-substituted amino, mono- and $C_2$-$C_{12}$ alkylamido (—NH—(CO)-alkyl), imino (—CR=NH where R=hydrogen, $C_1$-$C_{12}$ alkyl. etc.), alkylimino (—CR=N(alkyl), where R=hydrogen, alkyl, etc.), $C_1$-$C_{20}$ alkylsulfanyl (—S-alkyl; also termed "alkylthio"), $C_5$-$C_{18}$ arylsulfanyl (—S-aryl; also termed "arylthio"), $C_1$-$C_{20}$ alkylsulfinyl (—(SO)-alkyl), $C_1$-$C_{20}$ alkylsulfonyl ($SO_2$-alkyl), phosphono (—P(O)(OH)$_2$), and the hydrocarbyl moieties $C_1$-$C_{24}$ alkyl (preferably $C_1$-$C_{12}$ alkyl). In addition, the aforementioned functional groups may, if a particular group permits, be further substituted with one or more additional functional groups or with one or more hydrocarbyl moieties such as those specifically enumerated above. Analogously, the above-mentioned hydrocarbyl moieties may be further substituted with one or more functional groups or additional hydrocarbyl moieties such as those specifically enumerated. When the term "substituted" appears prior to a list of possible substituted groups, it is intended that the term apply to every member of that group.

The term "fluorinated" refers to replacement of a hydrogen atom in a molecule or molecular segment with a fluorine atom, and includes perfluorinated moieties. The term "perfluorinated" is also used in its conventional sense to refer to a molecule or molecular segment wherein all hydrogen atoms are replaced with fluorine atoms. Thus, a "fluorinated" methyl group encompasses —$CH_2F$ and —$CHF_2$ as well as the "perfluorinated" methyl group, i.e., —$CF_3$ (trifluoromethyl). The term "fluoroalkyl" refers to a fluorinated alkyl group, the term "fluoroalkylene" refers to a fluorinated alkylene linkage, the term "fluoroalicyclic" refers to a fluorinated alicyclic moiety, and the like. "Fluorocarbyl" refers to fluorinated hydrocarbyl group.

"Optional" or "optionally" means that the subsequently described circumstance may or may not occur, so that the description includes instances where the circumstance occurs and instances where it does not. For example, the phrase "optionally substituted" means that a non-hydrogen substituent may or may not be present on a given atom, and, thus, the description includes structures wherein a non-hydrogen substituent is present and structures wherein a non-hydrogen substituent is not present.

The term "acid-cleavable" refers to a molecular segment containing at least one covalent bond that is cleaved upon exposure to acid. Typically, the reaction of acid-cleavable groups herein with photogenerated acid occurs only, or is promoted greatly by, the application of heat. Those skilled in the art will recognize the various factors that influence the rate and ultimate degree of cleavage of acid-cleavable groups as well as the issues surrounding integration of the cleavage step into a viable manufacturing process. The product of the cleavage reaction is generally an acidic group, which, when present in sufficient quantities, imparts solubility to the polymers of the invention in basic aqueous solutions.

Analogously, the term "acid-inert" refers to a substituent that is not cleaved or otherwise chemically modified upon contact with photogenerated acid.

The terms "photogenerated acid" and "photoacid" are used interchangeably herein to refer to the acid that is created upon exposure of the present photoresist compositions to radiation, by virtue of the photoacid generator contained in the compositions.

The term "substantially transparent" as used to describe a polymer that is "substantially transparent" to radiation of a particular wavelength refers to a polymer that has an absorbance of less than about 5.0/micron, preferably less than about 3.0/micron, most preferably less than about 1.5/micron, at a selected wavelength.

For additional information concerning terms used in the field of lithography and lithographic compositions, see *Introduction to Microlithography*, Eds. Thompson et al. (Washington, D.C.: American Chemical Society, 1994).

It should be understood that the preceding is merely a detailed description of a number of preferred embodiments of the present invention and that numerous changes to the disclosed embodiments can be made in accordance with the disclosure herein without departing from the spirit or scope of the invention. The preceding description, therefore, is not meant to limit the scope of the invention in any respect. Rather, the scope of the invention is to be determined only by the issued claims and their equivalents.

What is claimed is:

1. A resist composition comprising:
   a) a photoresist polymer that does not comprise a silsesquioxane polymer;
   b) at least one photoacid generator;
   c) a solvent; and
   d) a resist additive compound including a polymer, oligomer or cage structure having the following structure A:

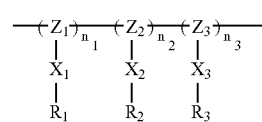

wherein,
   each $Z_1$, $Z_2$, and $Z_3$ independently represents a member selected from the group consisting of linear, branched, or cyclic alkylene, and linear, branched or cyclic heteroalkylene;
   $n_1$, $n_2$ and $n_3$ independently represent the number of repeat units of each type in the polymer, oligomer, or cage structure; and $n_1+n_2+n_3 \geq 2$;

$X_1$, $X$, and $X_3$ independently represents a member selected from the group consisting of linear, branched, or cyclic alkylene, linear, branched or cyclic heteroalkylene, carboxyl, and carbonyl;

$R_1$ is a moiety containing a fluoroalcohol group that is unprotected or partially or fully protected with an acid-labile group; and $R_2$ is selected from H, or a moiety containing carboxylic acid, sulfonamide, fluoroalcohol, or sulfonic acid, that is unprotected or partially or fully protected with an acid-labile group; and $R_3$ is a nonfluorinated or partially fluorinated or perfluorinated functionality, other than a fluorinated ether, that is acid-labile or non-acid labile, wherein the functionality does not comprise an unsaturated hydrocarbon group;

provided that
the resist additive compound contains a fluorocarbyl moiety other than a fluorinated ether;
if $Z_1$, $Z_2$ and/or $Z_3$ is

then $X_1$ and $R_1$ together, $X_2$ and $R_2$ together, and/or $X_3$ and $R_3$ together can represent hydrogen;
if $Z_1$, $Z_2$ and/or $Z_3$ is

and $X_1$, $X_2$ and/or $X_3$ is alkylene, then $R_1$, $R_2$ and $R_3$ are not —C(CF$_3$)$_2$—OH;
if $X_1$, $X_2$ and/or $X_3$ is carboxyl, then $R_1$, $R_2$ and $R_3$ are not norbornyl substituted by —CH$_2$—C(CF$_3$)$_2$—OH; and
If $Z_1$, $Z_2$ and/or $Z_3$ is linear alkylene, and $X_1$, $X_2$ and/or $X_3$ is methylene, then $R_1$, $R_2$ and $R_3$ are not —C(CF$_3$)$_2$—OH;
and provided that the compound does not comprise a structure selected from the group consisting of:

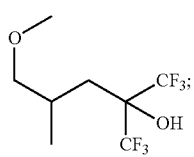

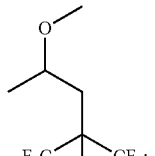

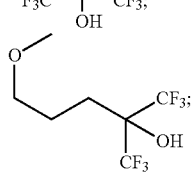

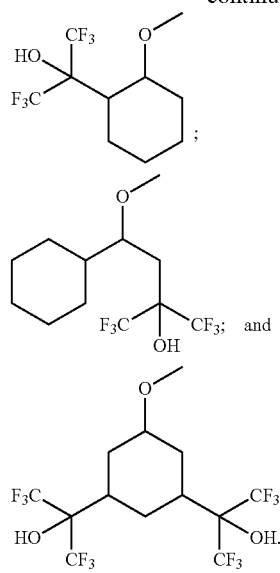

2. The resist composition according to claim 1, wherein the compound is soluble in an aqueous alkaline developer.

3. The resist composition according to claim 1, wherein the compound has a high surface activity.

4. The resist composition according to claim 1, wherein the compound includes a polymer or an oligomer having the structure A1:

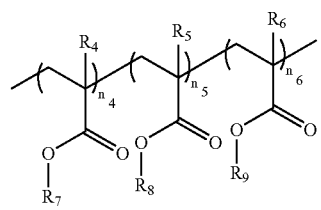

A1 wherein
$R_4$, $R_5$, and $R_6$ are independently H, alkyl, or fluoroalkyl;

$R_7$ is a linear, branched, or cyclic alkylene, linear, branched or cyclic heteroalkylene group containing one or more fluoroalcohol groups that are unprotected or partially or fully protected with an acid-labile group; and $R_8$ is selected from H or linear, branched, or cyclic alkylene, linear, branched or cyclic heteroalkylene groups containing one or more carboxylic acid, sulfonamide, fluoroalcohol, or sulfonic acid moieties, that are unprotected or partially or fully protected with an acid-labile group; and $R_9$ is a nonfluorinated or partially fluorinated or perfluorinated functionality, other than a fluorinated ether, that is acid-labile or non-acid labile;

$n_4$, $n_5$, and $n_6$ are integers such that $n_4+n_5+n_6$ is greater than or equal to 2.

5. The resist composition according to claim 1, wherein the compound includes a polymer or oligomer having the structure A2:

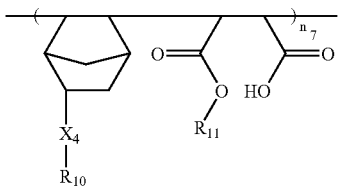

wherein
- $X_4$ is a member selected from the group consisting of linear, branched, or cyclic alkylene, linear, branched or cyclic heteroalkylene, carboxyl, and carbonyl;
- $R_{10}$ and $R_{11}$ are independently selected from H and linear, branched, or cyclic alkylene, linear, branched or cyclic heteroalkylene groups containing one or more carboxylic acid, sulfonamide, fluoroalcohol, or sulfonic acid moieties, that are unprotected or partially or fully protected with an acid-labile group, or a nonfluorinated or partially fluorinated or perfluorinated functionality, other than a fluorinated ether, that is acid-labile or non-acid labile, provided that one of $R_{10}$ and $R_{11}$ is a partially fluorinated or perfluorinated functionality, other than a fluorinated ether, that is acid-labile or non-acid labile;
- $n_7$ is an integer greater than or equal to 2.

6. The resist composition according to claim 1, wherein the compound includes a polymer or oligomer having the structure A3:

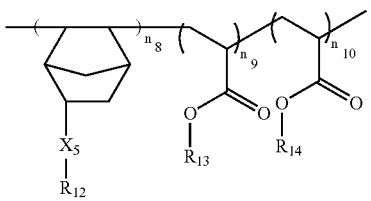

wherein
- $X_5$ represents a member selected from the group consisting of linear, branched, or cyclic alkylene, linear, branched or cyclic heteroalkylene, carboxyl, and carbonyl;
- $R_{12}$ is selected from H, carboxylic acid, sulfonamide, fluoroalcohol, or sulfonic acid, that is unprotected or partially or fully protected with an acid-labile group, or a nonfluorinated or partially fluorinated or perfluorinated functionality (other than a fluorinated ether) that is acid-labile or non-acid labile; and
- $R_{13}$ is a linear, branched, or cyclic alkylene, linear, branched or cyclic heteroalkylene group containing one or more fluoroalcohol groups that are unprotected or partially or fully protected with an acid-labile group; and
- $R_{14}$ is selected from H and linear, branched, or cyclic alkylene, linear, branched or cyclic heteroalkylene groups containing one or more carboxylic acid, sulfonamide, fluoroalcohol, or sulfonic acid moieties, that are unprotected or partially or fully protected with an acid-labile group, or a nonfluorinated or partially fluorinated or perfluorinated functionality (other than a fluorinated ether) that is acid-labile or non-acid labile, provided one of $R_{12}$ and $R_{14}$ is a fluorocarbyl moiety other than a fluorinated ether;
- $n_8$, $n_9$, $n_{10}$ are integers such that $n_8+n_9+n_{10}$ is greater than or equal to 2.

7. A method forming a patterned material layer on a substrate, the method comprising the following steps:
   a) providing a substrate having a material layer on a surface thereof;
   b) coating the substrate with the resist composition according to claim 1, thereby forming a coated substrate;
   c) patternwise exposing the coated substrate to imaging irradiation;
   d) optionally post-exposure baking the said exposed layer;
   e) contacting the coated substrate with an aqueous alkaline developer, wherein a portion of the resist composition is removed, thereby forming a pattern in the resist composition on the material layer; and
   f) transferring the pattern in the resist composition to the material layer.

8. The method according to claim 7, which is carried out under immersion lithography conditions.

9. The method of claim 8, wherein the additive rises to the surface of the resist composition, thereby inhibiting the leaching of unwanted material into immersion fluid.

10. The method according to claim 7, wherein the compound of the resist composition includes a polymer or an oligomer having the structure A1:

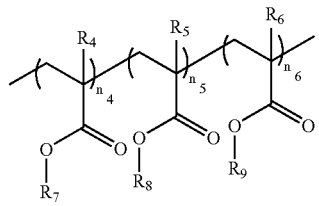

wherein
- $R_4$, $R_5$, and $R_6$ are independently H, alkyl, or fluoroalkyl;
- $R_7$ is a linear, branched, or cyclic alkylene, linear, branched or cyclic heteroalkylene group containing one or more fluoroalcohol groups that are unprotected or partially or fully protected with an acid-labile group; and
- $R_8$ is selected from H or linear, branched, or cyclic alkylene, linear, branched or cyclic heteroalkylene groups containing one or more carboxylic acid, sulfonamide, fluoroalcohol, or sulfonic acid moieties, that are unprotected or partially or fully protected with an acid-labile group; and
- $R_9$ is a nonfluorinated or partially fluorinated or perfluorinated functionality, other than a fluorinated ether, that is acid-labile or non-acid labile;
- $n_4$, $n_5$, and $n_6$ are integers such that $n_4+n_5+n_6$ is greater than or equal to 2.

11. The method according to claim 7, wherein the compound of the resist composition includes a polymer or oligomer having the structure A2:

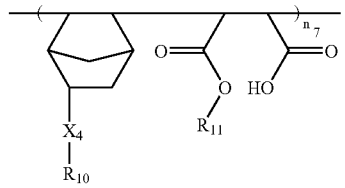

wherein

X₄ is a member selected from the group consisting of linear, branched, or cyclic alkylene, linear, branched or cyclic heteroalkylene, carboxyl, and carbonyl;

$R_{10}$ and $R_{11}$ are independently selected from H and linear, branched, or cyclic alkylene, linear, branched or cyclic heteroalkylene groups containing one or more carboxylic acid, sulfonamide, fluoroalcohol, or sulfonic acid moieties, that are unprotected or partially or fully protected with an acid-labile group, or a nonfluorinated or partially fluorinated or perfluorinated functionality, other than a fluorinated ether, that is acid-labile or non-acid labile, provided that one of $R_{10}$ and $R_{11}$ is a partially fluorinated or perfluorinated functionality, other than a fluorinated ether, that is acid-labile or non-acid labile;

$n_7$ is an integer greater than or equal to 2.

12. The method according to claim 7, wherein the compound of the resist composition includes a polymer or oligomer having the structure A3:

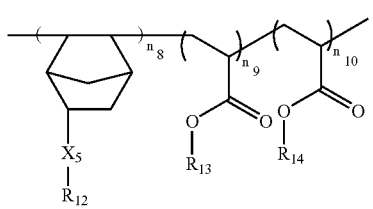

A3 wherein

X₅ represents a member selected from the group consisting of linear, branched, or cyclic alkylene, linear, branched or cyclic heteroalkylene, carboxyl, and carbonyl;

$R_{12}$ is selected from H, carboxylic acid, sulfonamide, fluoroalcohol, or sulfonic acid, that is unprotected or partially or fully protected with an acid-labile group, or a nonfluorinated or partially fluorinated or perfluorinated functionality (other than a fluorinated ether) that is acid-labile or non-acid labile; and $R_{13}$ is a linear, branched, or cyclic alkylene, linear, branched or cyclic heteroalkylene group containing one or more fluoroalcohol groups that are unprotected or partially or fully protected with an acid-labile group; and $R_{14}$ is selected from H and linear, branched, or cyclic alkylene, linear, branched or cyclic heteroalkylene groups containing one or more carboxylic acid, sulfonamide, fluoroalcohol, or sulfonic acid moieties, that are unprotected or partially or fully protected with an acid-labile group, or a nonfluorinated or partially fluorinated or perfluorinated functionality (other than a fluorinated ether) that is acid-labile or non-acid labile, provided one of $R_{12}$ and $R_{14}$ is a fluorocarbyl moiety other than a fluorinated ether;

$n_8, n_9, n_{10}$ are integers such that $n_8+n_9+n_{10}$ is greater than or equal to 2.

13. A substrate composition comprising:
a) a substrate having a material layer on a surface thereof; and
b) a layer of the resist composition according to claim 1 formed on the material layer.

14. A resist composition comprising:
a) a photoresist polymer;
b) at least one photoacid generator;
c) a solvent; and
d) a resist additive compound having one of the following structures:

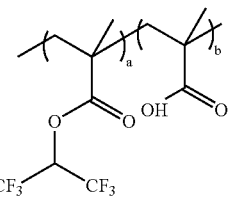

wherein a:b=2-98 mole %: 98-2 mole %, and a+b=100 mole %;

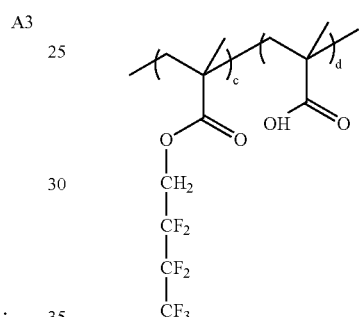

wherein c:d=2-98 mole %:98-2 mole %, and c+d=100 mole %;

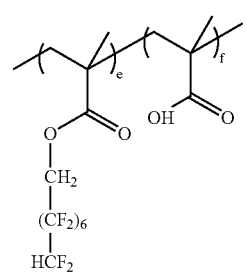

wherein e:f=2-98 mole %:98-2 mole %, and e+f=100 mole %;

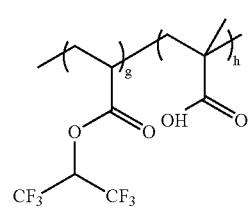

wherein g:h=2-98 mole %:98-2 mole %, and g+h=100 mole %;

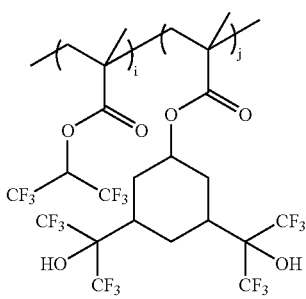
wherein i:j=2-98 mole %:98-2 mole %, and i+j=100 mole %;
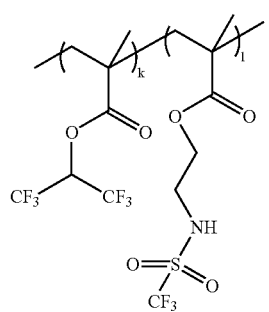
wherein k:l=2-98 mole %:98-2 mole %, and k+l=100 mole %;
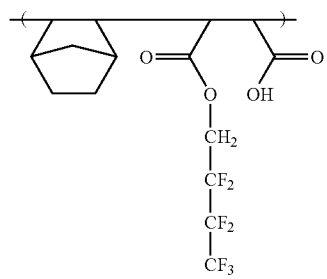
Polymer 16
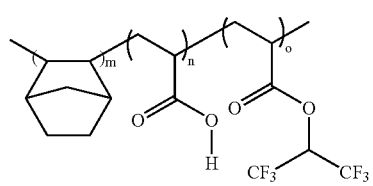
wherein m:n:o=2-96 mole %:96-2 mole %:2-96 mole %, and m+n+o=100 mole %;
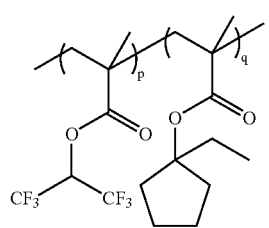
wherein p:q=2-98 mole %:98-2 mole %, and p+q=100 mole %;
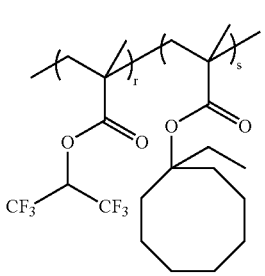
wherein r:s=2-98 mole %:98-2 mole %, and r+s=100 mole %;
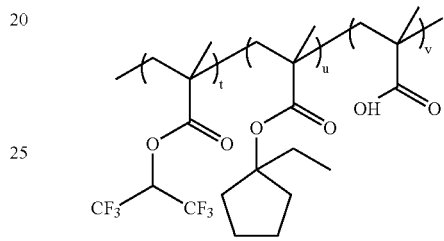
wherein t:u:v=2-96 mole %:96-2 mole %:2-96 mole %, and t+u+v=100 mole %;
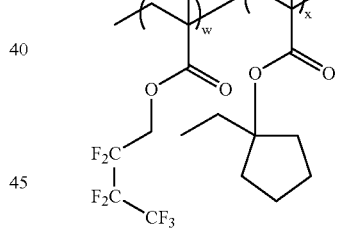
wherein w:x=2-98 mole %:98-2 mole %, and w+x=100 mole %;
Polymer 28
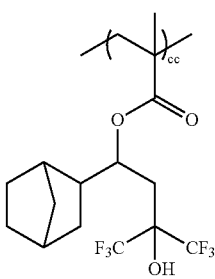

-continued

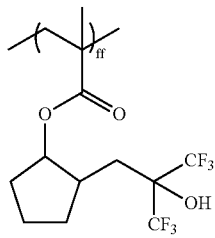

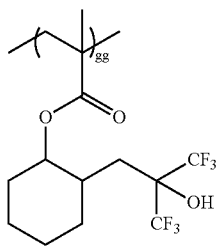

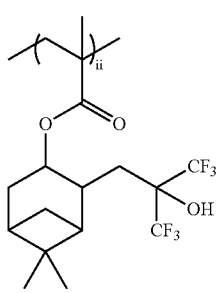

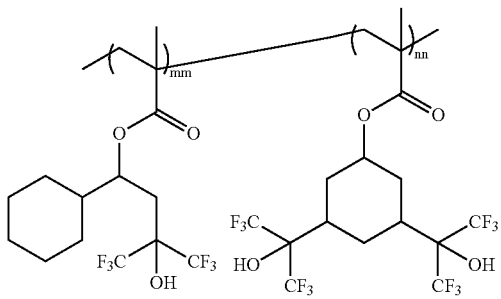

wherein mm:nn=2-98 mole %:98-2 mole %, and mm+nn=100 mole %;

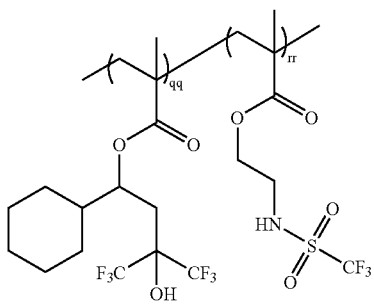

wherein qq:rr=2-98 mole %:98-2 mole %, and qq+rr=100 mole %;

Polymer 31

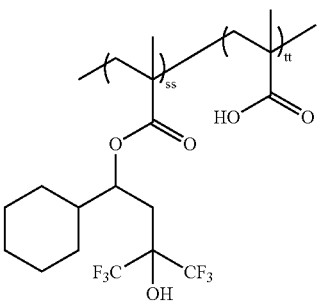

Polymer 32

Polymer 34

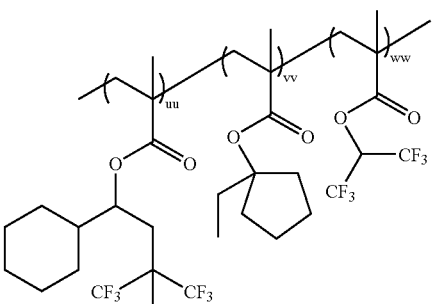

wherein ss:tt=2-98 mole %:98-2 mole %, and ss+tt=100 mole %;

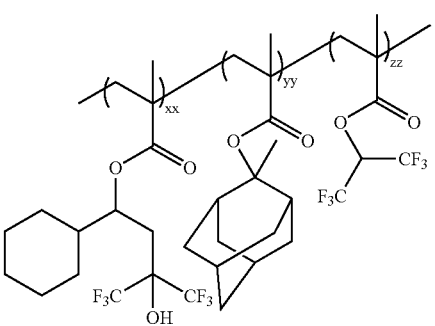

wherein uu:vv:ww=2-96 mole %:96-2 mole %:2-96 mole %, and uu+vv+ww=100 mole %; and

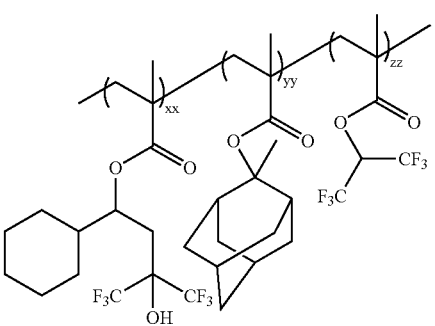

wherein xx:yy:zz=2-96 mole %:96-2 mole %:2-96 mole %, and xx+yy+zz=100 mole %.

15. A method forming a patterned material layer on a substrate, the method comprising the following steps:
   a) providing a substrate having a material layer on a surface thereof;
   b) coating the substrate with the resist composition according to claim 14, thereby forming a coated substrate;
   c) patternwise exposing the coated substrate to imaging irradiation;
   d) optionally post-exposure baking the said exposed layer;
   e) contacting the coated substrate with an aqueous alkaline developer, wherein a portion of the resist composition is removed, thereby forming a pattern in the resist composition on the material layer; and
   f) transferring the pattern in the resist composition to the material layer.

16. A substrate composition comprising:
a) a substrate having a material layer on a surface thereof; and
b) a layer of the resist composition according to claim 14 formed on the material layer.

* * * * *